US012721013B2

(12) United States Patent
Lee et al.

(10) Patent No.: US 12,721,013 B2
(45) Date of Patent: Aug. 25, 2026

(54) DISPLAY DEVICE

(71) Applicant: Samsung Display Co., LTD., Yongin-si (KR)

(72) Inventors: Gyujeong Lee, Yongin-si (KR); Yong Seok Kim, Yongin-si (KR); Minhee Son, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 405 days.

(21) Appl. No.: 18/405,971

(22) Filed: Jan. 5, 2024

(65) Prior Publication Data

US 2024/0298506 A1 Sep. 5, 2024

(30) Foreign Application Priority Data

Mar. 2, 2023 (KR) ........................ 10-2023-0028010

(51) Int. Cl.
*H10K 59/80* (2023.01)
*H10K 59/131* (2023.01)
*H10K 59/40* (2023.01)
*H10K 59/88* (2023.01)

(52) U.S. Cl.
CPC ......... *H10K 59/875* (2023.02); *H10K 59/131* (2023.02); *H10K 59/40* (2023.02); *H10K 59/873* (2023.02); *H10K 59/88* (2023.02)

(58) Field of Classification Search
None
See application file for complete search history.

(56) References Cited

U.S. PATENT DOCUMENTS

2018/0350883 A1 12/2018 Lee et al.
2021/0200382 A1 7/2021 Lee et al.
2022/0199700 A1* 6/2022 Shin ...................... G06F 3/0412
2022/0261106 A1* 8/2022 Yueh ..................... G06F 3/0443

FOREIGN PATENT DOCUMENTS

KR 101983065 B1 5/2019
KR 1020230104506 A 7/2023

OTHER PUBLICATIONS

Extended European Search Report mailed May 27, 2024 in EP Application No. 24150382.0, 7 pages.

* cited by examiner

*Primary Examiner* — Christopher J Kohlman
(74) *Attorney, Agent, or Firm* — CANTOR COLBURN LLP

(57) ABSTRACT

A display device includes a substrate including a light emitting area, a light emitting element in the light emitting area on the substrate, an encapsulation layer on the substrate and covering the light emitting element, a light transmission pattern on the encapsulation layer, a light control pattern on the encapsulation layer to surround a side surface of the light transmission pattern, a first electrode pattern on the encapsulation layer to be spaced apart from the light emitting area and to at least partially surround the side surface of the light transmission pattern, extending along a first direction, and directly connected to the light control pattern, and a second electrode pattern on the encapsulation layer to be spaced apart from the light emitting area, disposed to surround the side surface of the light transmission pattern, extending along a second direction, and directly connected to the light control pattern.

25 Claims, 16 Drawing Sheets

A
ISL
DP
PNL
ENC
IL3
IL2
IL1
BFR
SUB
I'
I
NEA
EA3
EA1
SP1
SP2
BD1
BD2
BD3
BD4
LCP
LCP1
LCP2
LTP
LTP1
LTP2
PDL
LED
ADE
EL
CTE
CE1
ACT
GAT
CE2
TR

ISL"
SA
IE'2-2
IE'2-4
CP'1
IE'2-6
SP"1
IE'2-8
SP"2
PA
IE'1-1
IE'1-2
IE'1-3
IE'1-4
IE'1-5
IE'1-6
IE'1-7
IE'1-8
IE'1-9
CP'2
D
E
IE'2-1
IE'2-3
IE'2-5
IE'2-7
IE'2-9
NDA-PD

E
ISL"
DP
PNL
ENC
IL3
IL2
IL1
BFR
SUB
NEA
EA3
EA1
LCP
LTP
LCP2
LCP1
LTP1
LTP2
CP'1
CP'2
PDL
LED
ADE
EL
CTE
CE1
ACT
GAT
CE2
TR

D
ISL"
DP
PNL
ENC
IL3
IL2
IL1
BFR
SUB
NEA
EA3
EA1
LCP
LTP
LCP1
LCP2
LTP1
LTP2
SP"1
SP"2
CP"1
CP"2
PDL
LED
ADE
EL
CTE
CE1
ACT
GAT
CE2
TR

DISPLAY DEVICE

This application claims priority to Korean Patent Application No. 10-2023-0028010, filed on Mar. 2, 2023, and all the benefits accruing therefrom under 35 U.S.C. § 119, the content of which in its entirety is herein incorporated by reference.

BACKGROUND

1. Field

The disclosure relates to a display device. More specifically, the disclosure relates to a display device in which a viewing angle is controlled.

2. Description of the Related Art

A display device is a device that displays an image and includes a display area for displaying an image. Recently, demands for a display device in which a viewing angle of an image displayed in a display area is controlled is increasing.

Accordingly, a display device capable of controlling the viewing angle of an image displayed in a display area is being researched.

SUMMARY

Embodiments provide a display device having a simplified laminated structure.

A display device according to an embodiment includes a substrate on which a light emitting area is defined, a light emitting element disposed in the light emitting area on the substrate, an encapsulation layer disposed on the substrate and covering the light emitting element, a light transmission pattern disposed on the encapsulation layer, a light control pattern disposed on the encapsulation layer and disposed to surround at least a portion of a side surface of the light transmission pattern, a first electrode pattern disposed on the encapsulation layer to be spaced apart from the light emitting area and to surround at least a portion of the side surface of the light transmission pattern, where the first electrode pattern extends along a first direction, and is directly connected to at least a portion of the light control pattern, and a second electrode pattern disposed on the encapsulation layer to be spaced apart from the light emitting area and to surround at least a portion of the side surface of the light transmission pattern, where the second electrode pattern extends along a second direction crossing the first direction, and is directly connected to at least a portion of the light control pattern.

In an embodiment, the light control pattern, the first electrode pattern, and the second electrode pattern may include a same material as each other.

In an embodiment, each of the light control pattern, the first electrode pattern, and the second electrode pattern may include molybdenum (Mo).

In an embodiment, the first electrode pattern and the second electrode pattern may have a mesh structure.

In an embodiment, the first electrode pattern may include first sensing parts arranged along the first direction and first connection parts electrically connecting the first sensing parts to each other, and the second electrode pattern may include second sensing parts arranged along the second direction and second connection parts electrically connecting the second sensing parts to each other.

In an embodiment, the light control pattern may include a first light control pattern disposed on the encapsulation layer and a second light control pattern disposed on the first light control pattern, and the light transmission pattern may include a first light transmission pattern in which at least a portion of a side surface is surrounded by the first light control pattern and a second light transmission pattern in which at least a portion of a side surface is surrounded by the second light control pattern.

In an embodiment, the first sensing parts may include a first body part disposed to surround at least a portion of the side surface of the first light transmission pattern and a second body part disposed on the first body part, disposed to surround at least a portion of the side surface of the second light transmission pattern, and contacting the first body part, and the second sensing parts may include a third body part disposed to surround at least a portion of the side surface of the first light transmission pattern and a fourth body part disposed on the third body part, disposed to surround at least a portion of the side surface of the second light transmission pattern, and contacting the third body part.

In an embodiment, the first light control pattern, the first body part, and the third body part may include a same material as each other, and the second light control pattern, the second body part, and the fourth body part may include a same material as each other.

In an embodiment, the display device may include a first touch signal line electrically connected to the first electrode pattern and a second touch signal line electrically connected to the second electrode pattern.

In an embodiment, the first electrode pattern may be a sensing electrode, the second electrode pattern may be a driving electrode, the first touch signal line may be a touch sensing line, and the second touch signal line may be a touch driving line.

In an embodiment, the first sensing parts may include a first body part disposed to surround at least a portion of the side surface of the first light transmission pattern, where the first body part may include a same material as the first light control pattern, the second sensing parts may include a second body part disposed on the first sensing parts to surround at least a portion of the side surface of the second light transmission pattern, where the second body part may include a same material as the second light control pattern, and the first body part of the first sensing parts and the second body part of the second sensing parts may be spaced apart from each other.

In an embodiment, the display device may further include a first touch signal line electrically connected to the first electrode pattern and a second touch signal line electrically connected to the second electrode pattern.

In an embodiment, the first electrode pattern may be a sensing electrode, the second electrode pattern may be a driving electrode, the first touch signal line may be a touch sensing line, and the second touch signal line may be a touch driving line.

In an embodiment, the first sensing parts may surround at least a portion of the side surface of the first light transmission pattern, include a same material as the first light control pattern, and are electrically connected to each other by a bridge electrode, and the bridge electrode may be disposed to surround at least a portion of the side surface of the second light transmission pattern, and include a same material as the second light control pattern.

In an embodiment, the first connection parts may be disposed to surround at least a portion of the side surface of the first light transmission pattern, the second connection parts may be disposed on the first connection parts to surround at least a portion of the side surface of the second light transmission pattern, and the first connection parts and the second connection parts may be spaced apart from each other.

In an embodiment, the display device may further includes a dummy electrode pattern disconnected from the first electrode pattern and the second electrode pattern, where the dummy electrode pattern may include a same material as the first electrode pattern and the second electrode pattern, and be directly connected to at least a portion of the light control pattern.

A display device according to an embodiment includes a substrate on which a light emitting area is defined, a light emitting element disposed in the light emitting area on the substrate, an encapsulation layer disposed on the substrate and covering the light emitting element, a first light control pattern disposed on the encapsulation layer, a first electrode pattern disposed on the encapsulation layer and directly connected to the first light control pattern, where the first electrode pattern includes first sensing parts arranged along a first direction and first connection parts electrically connecting the first sensing parts, a first light transmission pattern disposed on the encapsulation layer and in which at least a portion of a side surface is surrounded by the first light control pattern and the first electrode pattern, a second light control pattern disposed on the first light control pattern, a second electrode pattern disposed on the encapsulation layer and directly connected to the second light control pattern, wherein the second electrode pattern includes second sensing parts arranged along a second direction crossing the first direction and second connection parts electrically connecting the second sensing parts to each other, a second light transmission pattern disposed on the encapsulation layer, where at least a portion of a side surface of the second light transmission pattern is surrounded by the second light control pattern and the second electrode pattern, a first planarization layer disposed between the first connection parts of the first electrode pattern and the second connection parts of the second electrode pattern, and a second planarization layer covering the second connection parts of the second electrode pattern.

In an embodiment, the first connection parts and the second connection parts may be spaced apart from each other.

In an embodiment, the first connection parts may be disposed to surround at least a portion of the side surface of the first light transmission pattern, and the second connection parts may be disposed to surround at least a portion of the side surface of the second light transmission pattern.

In an embodiment, the first sensing parts may be disposed to surround at least a portion of the side surface of the first light transmission pattern and include a same material as the first light control pattern, the second sensing parts may be disposed on the first sensing parts to surround at least a portion of the side surface of the second light transmission pattern, and include a same material as the second light control pattern, and the first planarization layer may be further disposed between the first sensing parts of the first electrode pattern and the second sensing parts of the second electrode pattern.

In an embodiment, the first sensing parts and the second sensing parts may be spaced apart from each other.

In an embodiment, the display device may further include a first touch signal line electrically connected to the first sensing parts and a second touch signal line electrically connected to the second sensing parts.

In an embodiment, the first electrode pattern may be a sensing electrode, the second electrode pattern may be a driving electrode, the first touch signal line may be a touch sensing line, and the second touch signal line may be a touch driving line.

In an embodiment, the first electrode pattern and the second electrode pattern may be spaced apart from the light emitting area.

In an embodiment, the first electrode pattern and the second electrode pattern may have a mesh structure.

The display device according to embodiments may include a display panel and an input sensing layer disposed on the display panel. The input sensing layer may include a light transmission pattern, a light control pattern, a first electrode pattern operating as a sensing electrode when external input is sensed, and a second electrode pattern operating as a driving electrode when external input is sensed. In such embodiments, the light control pattern, the first electrode pattern, and the second electrode pattern may be arranged to surround a side surface of the light transmission pattern.

Accordingly, in such embodiments, an external input such as a touch or approach by an external medium may be sensed and a viewing angle of light emitted from a light emitting area may be controlled through the input sensing layer. Accordingly, the display device may not separately include a functional layer for sensing an external input and a functional layer for controlling a viewing angle. Accordingly, a stacked structure of the display device may be simplified and efficiency of the manufacturing process of the display device may be improved.

In such embodiments, the light control pattern, the first electrode pattern, and the second electrode pattern may be directly connected to each other. Accordingly, floating of the light control pattern may be substantially reduced or effectively prevented. Also, an occurrence of a phenomenon in which the light control pattern is separated from underlying structures may be substantially reduced or effectively prevented. Accordingly, driving efficiency and structural reliability of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
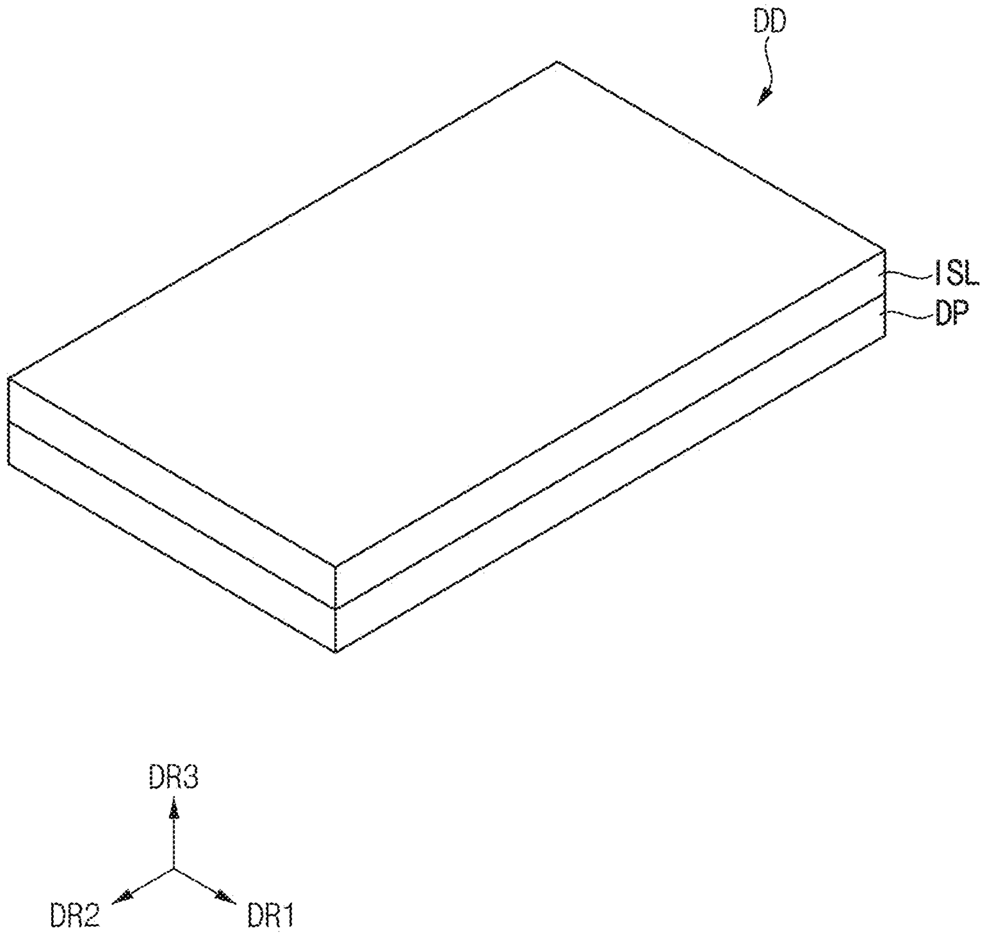
FIG. 1 is a perspective view schematically illustrating a display device according to embodiments.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

For the embodiments of the invention disclosed in the text, specific structural or functional descriptions are only exemplified for the purpose of explaining the embodiments of the invention, and the embodiments of the invention may be implemented in various forms and should not be construed as being limited to the embodiments described herein.

Since the invention can have various changes and various forms, specific embodiments will be illustrated in the drawings and described in detail in the text. However, this is not intended to limit the invention to a specific form disclosed, and should be understood to include all modifications, equivalents, and substitutes included in the spirit and scope of the invention.

It will be understood that when an element is referred to as being "on" another element, it can be directly on the other element or intervening elements may be therebetween. In contrast, when an element is referred to as being "directly on" another element, there are no intervening elements present.

Terms such as first and second may be used to describe various components, but the components should not be limited by the terms. The terms may be used for the purpose of distinguishing one component from another. For example, a first element may be termed a second element, and similarly, a second element may be termed a first element, without departing from the scope of the invention.

It should be understood that when an element is referred to as being "connected" to another element, it may be directly connected or connected to the other element, but other elements may exist in the middle. On the other hand, when an element is referred to as being "directly connected" to another element, it should be understood that no intervening elements exist. Other expressions describing the relationship between components, such as "between" and "directly between" or "adjacent to" and "directly adjacent to", etc., should be interpreted similarly.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless defined otherwise, all terms used herein, including technical or scientific terms, have the same meaning as commonly understood by one of ordinary skill in the art to which the invention belongs. Terms such as those defined in commonly used dictionaries should be interpreted as having a meaning consistent with the meaning in the context of the related art, and unless explicitly defined in this application, they are not interpreted in an ideal or excessively formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a perspective view schematically illustrating a display device according to embodiments.

Referring to FIG. 1, an embodiment of the display device DD may display an image through a display surface. The display surface may be parallel to a plane defined by a first direction DR1 and a second direction DR2 crossing the first direction DR1. A third direction DR3 may be a normal direction of the display surface or a thickness direction of the display device DD.

In an embodiment, the display device DD may have a flat display surface. However, the invention is not limited thereto, and the display device DD may include display surface with various types capable of displaying the image. In an embodiment, for example, the display device DD may have a curved display surface or a three-dimensional display surface.

Although an embodiment of the display device DD in a rectangular plate shape having two pairs of parallel sides is shown in FIG. 1, the invention is not necessarily limited thereto, and the display device DD may have various shapes.

In an embodiment, the display device DD may be a vehicle display device. In an embodiment, for example, the display device DD may be disposed in an interior space of a vehicle including a driver's seat and a front passenger's seat. In such an embodiment, the display device DD may be disposed on a dashboard provided in an indoor space. In an embodiment, for example, the display device DD may be disposed on the dashboard in front of the driver's seat to provide vehicle speed information and the like. Also, the display device DD may be disposed in a center of the dashboard to provide map information and the like. Also, the display device DD may be disposed on the dashboard in front of the passenger's seat to provide entertainment information and the like. In an embodiment, the display device DD may be implemented as a head-up display for a vehicle.

However, a use of the display device DD is not necessarily limited to vehicles, and in an alternative embodiment, the display device DD may be used for large electronic devices such as televisions, monitors, electronic signboards, and the like, and also be used for small and medium-sized electronic devices such as mobile phones, tablets, smart watch, and the like. Also, the display device DD may be used in a wearable electronic device.

In an embodiment, the display device DD may be a flexible display device. In an embodiment, for example, the display device DD may be a foldable display device, a rollable display device, a slidable display device, or a bendable display device. However, the invention is not necessarily limited thereto, and the display device DD may be a rigid display device.

In an embodiment, as shown in FIG. 1, the display device DD may include a display panel DP and an input sensing layer ISL.

In an embodiment, the display panel DP and the input sensing layer ISL may be formed through a continuous process. However, the invention is not necessarily limited thereto, and alternatively, the display panel DP and the input sensing layer ISL may be bonded to each other through an adhesive member. The adhesive member may include a conventional adhesive or pressure-sensitive adhesive.

The display panel DP may be a light emitting display panel. In an embodiment, for example, the display panel DP may be an organic light emitting display panel, an inorganic light emitting display panel, a subminiature light emitting display panel, or a quantum dot light emitting display panel. Hereinafter, for convenience of description, embodiments where the display panel DP is an organic light emitting display panel will be described as an example.

The input sensing layer ISL may detect an external input such as a touch or approach by an external medium such as a hand or a pen to the display surface of the display device DD.

Although not shown, the display device DD may further include an anti-reflection layer and a window layer. In an embodiment, for example, the anti-reflection layer may be disposed on the input sensing layer ISL and reduce reflectance of external light incident on the display surface of the display device DD from an outside. In an embodiment, the anti-reflection layer may include color filters. The color filters may have a predetermined arrangement. In an embodiment, for example, the arrangement of the color filters may be determined in consideration of colors emitted from pixels included in the display panel DP. However, the invention is not necessarily limited thereto, and the anti-reflection layer may include a polarization layer and/or a phase retardation layer.

The window layer may be disposed on the input sensing layer ISL and may protect the display panel DP and the input sensing layer ISL from the outside. The window layer may include a glass substrate and/or a synthetic resin film.

Figure 2:
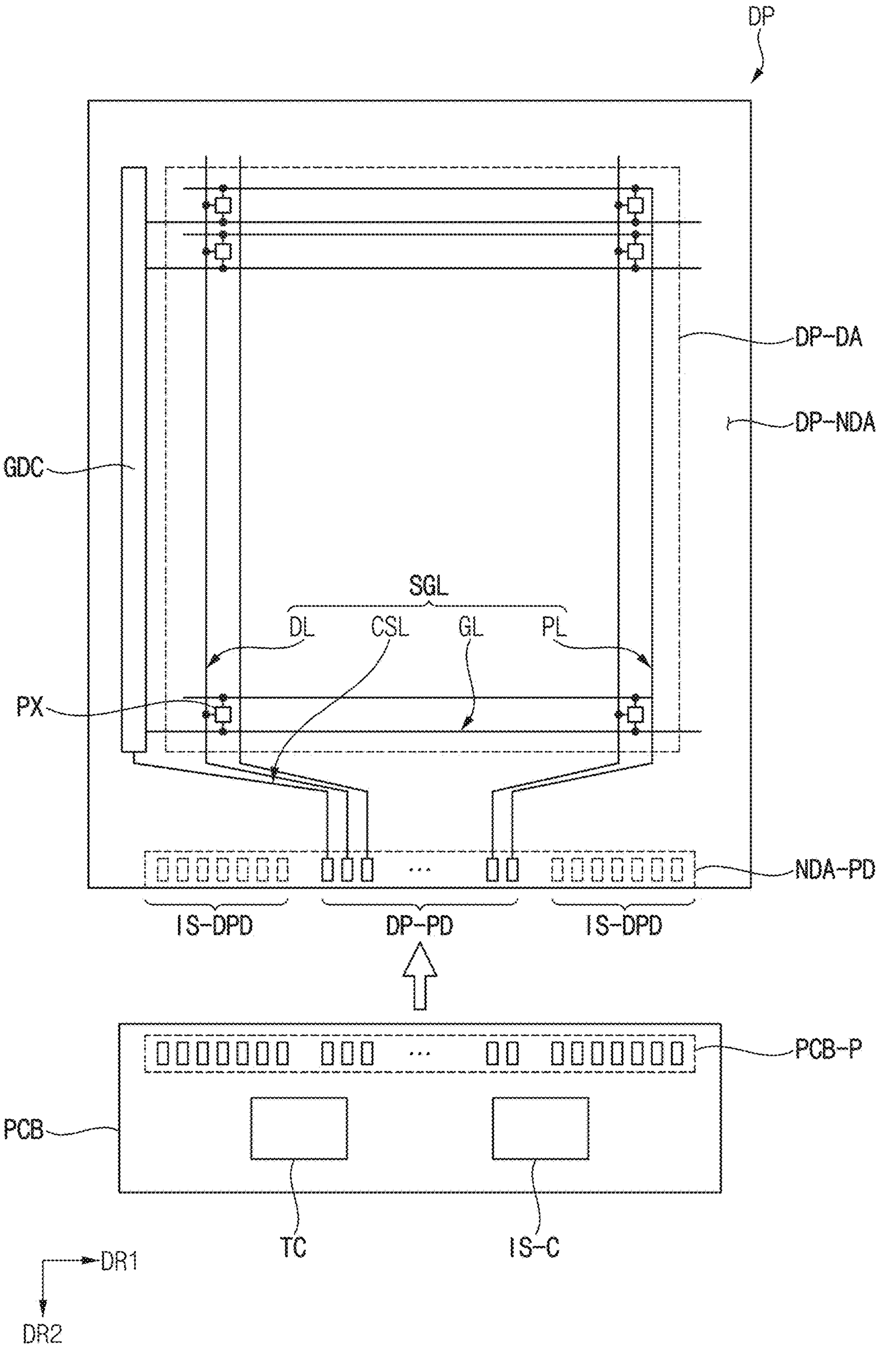
FIG. 2 is a plan view illustrating a display panel included in the display device of FIG. 1.

FIG. 2 is a plan view illustrating a display panel included in the display device of FIG. 1.

Referring to FIGS. 1 and 2, an embodiment of the display panel DP may include a display area DP-DA where the image is displayed and a non-display area DP-NDA located outside the display area DP-DA. In an embodiment, for example, the non-display area DP-NDA may surround the display area DP-DA.

The display panel DP may include a panel driving circuit GDC, signal lines SGL, signal pads DP-PD, and pixels PX.

The pixels PX may be disposed in the display area DP-DA. Each of the pixels PX may include a light emitting element and a pixel driving circuit connected to the light emitting element. In an embodiment, for example, the light emitting element may be an organic light emitting diode, an inorganic light emitting diode, a subminiature light emitting diode, or a quantum dot light emitting diode. Hereinafter, for convenience of description, embodiments where the light emitting element is an organic light emitting diode will be described as an example.

The panel driving circuit GDC may include a scan driving circuit. The scan driving circuit may generate scan signals and sequentially provide the scan signals to scan lines GL.

The signal lines SGL may include the scan lines GL, data lines DL, a power line PL, and a control signal line CSL. Each of the scan lines GL may be connected to a corresponding pixel among the pixels PX, and each of the data lines DL may be connected to a corresponding pixel among the pixels PX. The power line PL may be connected to the pixels PX. The control signal line CSL may provide control signals to the scan driving circuit.

The signal lines SGL may be disposed in the display area DP-DA and the non-display area DP-NDA. The signal lines SGL may be connected to corresponding signal pads among the signal pads DP-PD. An area in the non-display area DP-NDA where the signal pads DP-PD are disposed may be defined as a pad area NDA-PD.

The display panel DP may further include dummy pads IS-DPD disposed in the pad area NDA-PD. The dummy pads IS-DPD may be disposed in (or directly on) a same layer as the signal lines SGL. The dummy pads IS-DPD may be selectively provided in the display device DD including the input sensing layer ISL, and may be omitted in the display device DD including the input sensing panel attached to the display panel through an adhesive member.

In an embodiment, as shown in FIG. 2, the display device DD may further include a circuit board PCB electrically connected to the display panel DP. The circuit board PCB may be a flexible circuit board or a rigid circuit board. The circuit board PCB may be directly bonded to the display panel DP or connected to the display panel DP through another circuit board.

A timing control circuit TC for controlling an operation of the display panel DP may be disposed on the circuit board PCB. The timing control circuit TC may receive input image data and timing signals (e.g., a vertical sync signal, a horizontal sync signal, and clock signals) from an external device, and may generate a control signal for controlling the panel driving circuit GDC based on the timing signals, and may provide control signal to the panel driving circuit GDC. Also, the timing control circuit TC may generate a control signal for controlling a data driver, provide the control signal to the data driver, rearrange the input image data, and provide the input image data to the data driver.

In an embodiment, an input sensing circuit IS-C for controlling the input sensing layer ISL may be disposed on the circuit board PCB. The input sensing circuit IS-C may receive a timing signal (e.g., a vertical sync signal) from an external device and generate a touch driving signal based on the timing signal. In addition, the input sensing circuit IS-C may receive a sensing signal corresponding to an external input (e.g., a user's touch input) from the input sensing layer ISL, and may calculate or recognize a position of the external input based on the sensing signal.

In an embodiment, each of the timing control circuit TC and the input sensing circuit IS-C may be mounted on a circuit board PCB in a form of an integrated chip. In an alternative embodiment, the timing control circuit TC and the input sensing circuit IS-C may be mounted on the circuit board PCB in a form of a single integrated chip. The circuit board PCB may include circuit board pads PCB-P electrically connected to the display panel DP. The circuit board PCB may further include signal lines connecting the circuit board pads PCB-P and the timing control circuit TC and/or the input sensing circuit IS-C.

Figure 3:
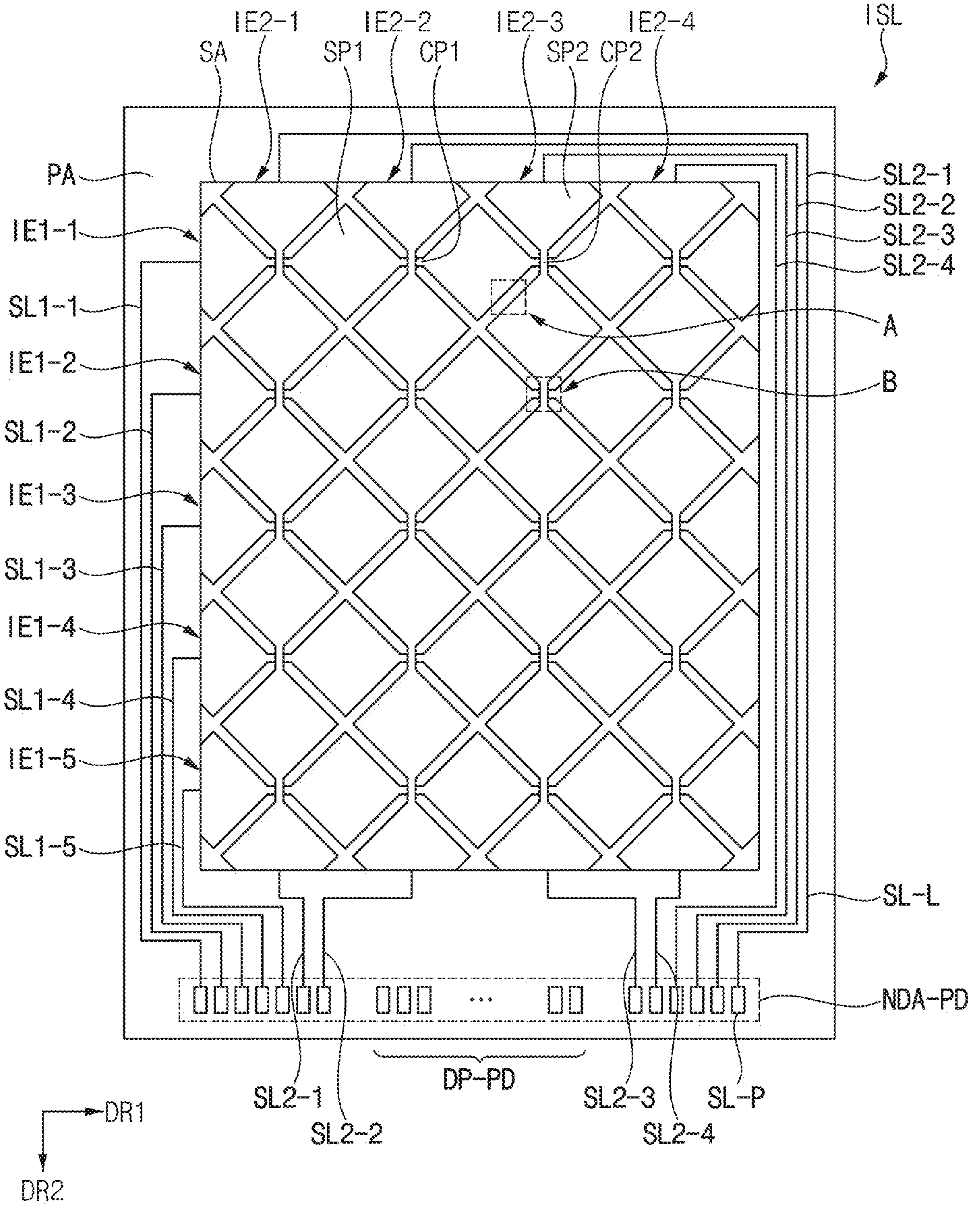
FIG. 3 is a plan view illustrating an input sensing layer included in the display device of FIG. 1.

FIG. 3 is a plan view illustrating an input sensing layer included in the display device of FIG. 1.

Referring to FIGS. 2 and 3, in an embodiment, the input sensing layer ISL may include a sensing area SA which senses an external input and a peripheral area PA positioned outside the sensing area SA.

The sensing area SA may correspond to the display area DP-DA of the display panel DP and may have an area substantially equal to or larger than the display area DP-DA. The peripheral area PA may surround the sensing area SA. In an embodiment, for example, the peripheral area PA may correspond to the non-display area DP-NDA of the display panel DP. The input sensing layer ISL may include first electrode patterns IE1-1 to IE1-5, second electrode patterns IE2-1 to IE2-4, first touch signal lines SL1-1 to SL1-5, and second touch signal lines SL2-1 to SL2-4.

The first electrode patterns IE1-1 to IE1-5 and the second electrode patterns IE2-1 to IE2-4 may be disposed in the sensing area SA, and the first touch signal lines SL1-1 to SL1-5 and the second touch signal lines SL2-1 to SL2-4 may be disposed in the peripheral area PA.

Each of the first electrode patterns IE1-1 to IE1-5 may include first sensing parts SP1 and first connection parts CP1. In one first electrode pattern, the first sensing parts SP1 may be arranged along the first direction DR1. Each of the first connection parts CP1 may be connected between adjacent first sensing parts, which are neighboring each other, among the first sensing parts SP1.

Each of the second electrode patterns IE2-1 to IE2-4 may include second sensing parts SP2 and second connection parts CP2. In one second electrode pattern, the second sensing parts SP2 may be arranged along the second direction DR2. Each of the second connection parts CP2 may be connected between adjacent second sensing parts, which are neighboring each other, among the second sensing parts SP2.

In an embodiment, the first electrode patterns IE1-1 to IE1-5 and the second electrode patterns IE2-1 to IE2-4 may include a metal material. In an embodiment, for example, the first electrode patterns IE1-1 to IE1-5 and the second electrode patterns IE2-1 to IE2-4 may include molybdenum (Mo), aluminum (Al), or titanium (Ti), copper (Cu), or the like.

In an embodiment, the first electrode patterns IE1-1 to IE1-5 and the second electrode patterns IE2-1 to IE2-4 may have a multi-layered structure further including molybdenum-tantalum oxide (MTO). In an embodiment, for example, the first electrode patterns IE1-1 to IE1-5 and the second electrode patterns IE2-1 to IE2-4 may have a three-layer structure such as MTO/Mo/MTO, MTO/Cu/MTO, or MTO/Al/MTO. Alternatively, the first electrode patterns IE1-1 to IE1-5 and the second electrode patterns IE2-1 to IE2-4 may have a two-layer structure such as MTO/Mo, MTO/Cu, or MTO/Al.

The first touch signal lines SL1-1 to SL1-5 may be connected to one end of the first electrode patterns IE1-1 to IE1-5, respectively. The second touch signal lines SL2-1 to SL2-4 may be connected to both ends of the second electrode patterns IE2-1 to IE2-4, respectively. However, the invention is not necessarily limited thereto. In an alternative embodiment, the first touch signal lines SL1-1 to SL1-5 may be connected to both ends of the first electrode patterns IE1-1 to IE1-5, respectively. The second touch signal lines SL2-1 to SL2-4 may be connected to one of the second electrode patterns IE2-1 to IE2-4, respectively.

The first touch signal lines SL1-1 to SL1-5 and the second touch signal lines SL2-1 to SL2-4 may include a line part SL-L and a pad part SL-P. The pad part SL-P may be aligned with the pad area NDA-PD. The pad part SL-P may overlap the dummy pads IS-DPD shown in FIG. 2.

In an embodiment, the first electrode patterns IE1-1 to IE1-5 may operate as a sensing electrode (Rx) when external input is sensed, and the second electrode patterns IE2-1 to IE2-4 may operate as a driving electrode (Tx) when external input is sensed. That is, the first touch signal lines SL1-1 to SL1-5 may be a touch sensing line, and the second touch signal lines SL2-1 to SL2-4 may be a touch driving line.

Although FIG. 3 shows an embodiment where the input sensing layer ISL includes five first electrode patterns IE1-1 to IE1-5 and four second electrode patterns IE2-1 to IE2-4, the invention is not necessarily limited thereto. In an alternative embodiment, for example, the input sensing layer ISL may include 4 or less or 6 or more first electrode patterns, and may include 3 or less or 5 or more second electrode patterns.

Also, although FIG. 3 shows an embodiment where the first sensing parts SP1 and the second sensing parts SP2 have a diamond shape, the invention is not necessarily limited thereto. In an alternative embodiment, for example, the first sensing parts SP1 and the second sensing parts SP2 may have a polygonal shape.

Figure 4:
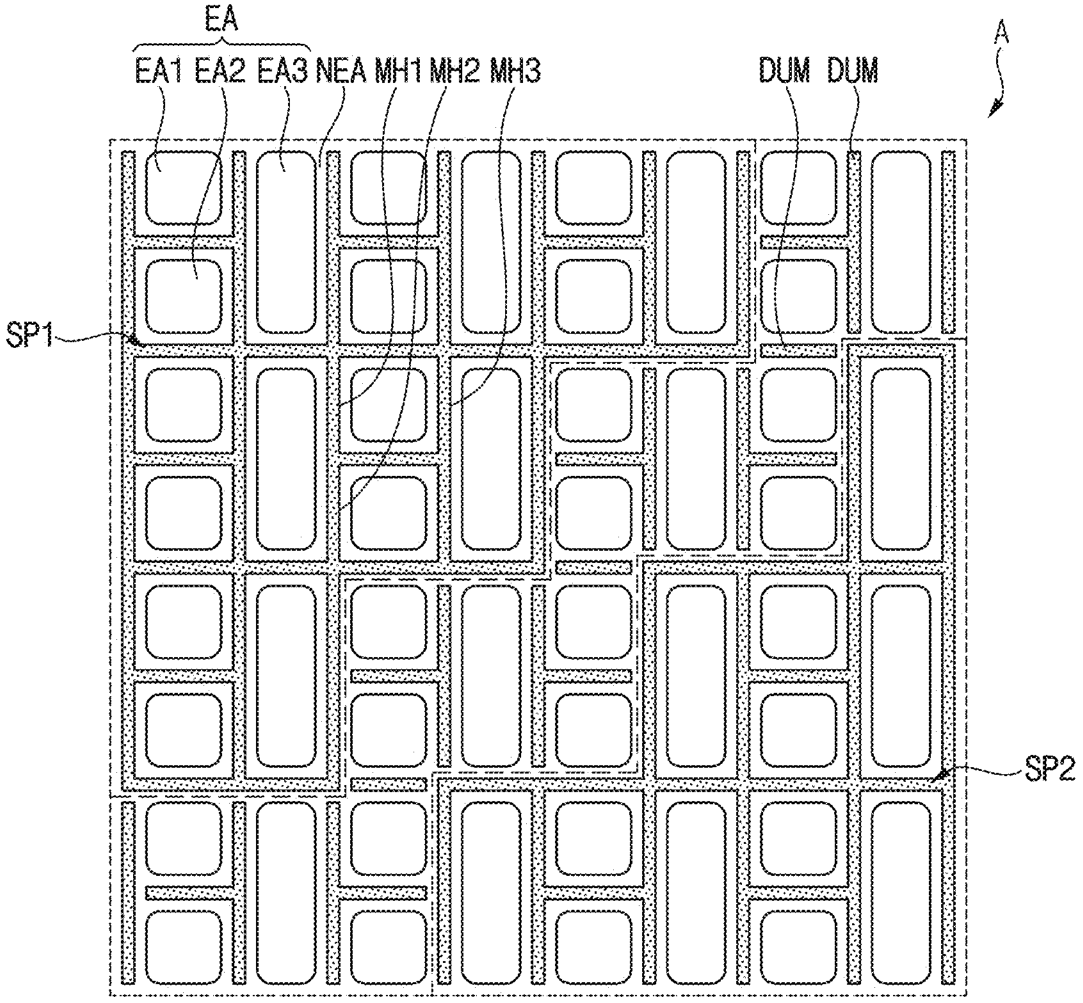
FIG. 4 is an enlarged view of electrode patterns in area A of FIG. 3.
Figure 5:
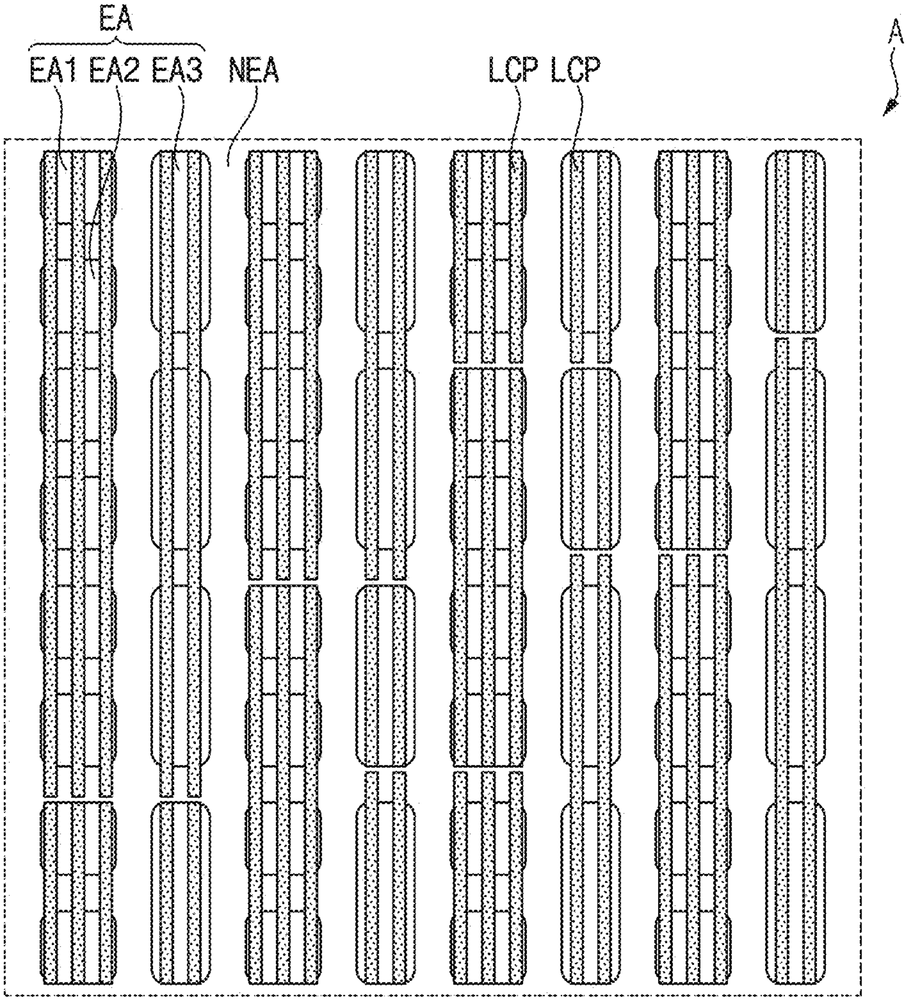
FIG. 5 is an enlarged view of light control patterns in area A of FIG. 3.
Figure 6:
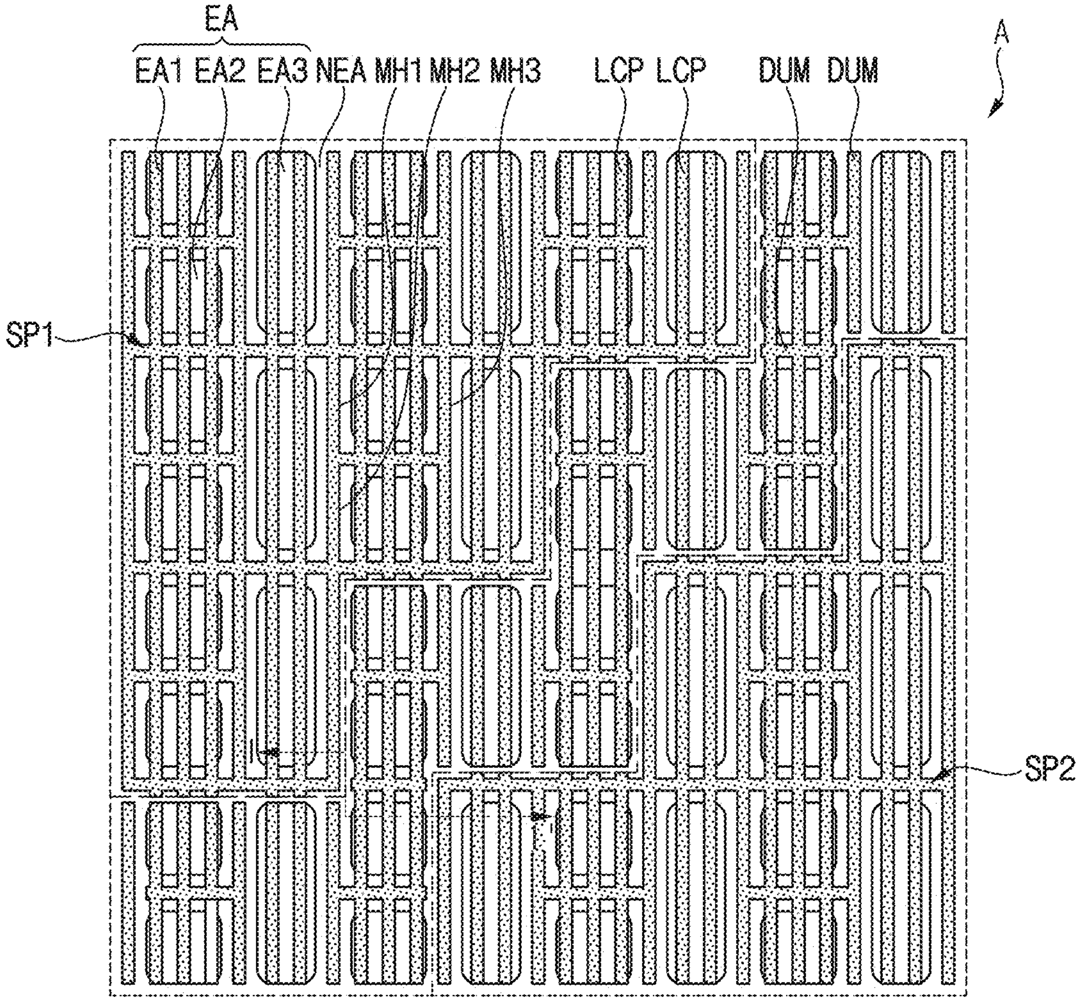
FIG. 6 is an enlarged view illustrating electrode patterns and light control patterns in area A of FIG. 3 together.

FIG. 4 is an enlarged view of electrode patterns in area A of FIG. 3, FIG. 5 is an enlarged view of light control patterns in area A of FIG. 3, and FIG. 6 is an enlarged view illustrating electrode patterns and light control patterns in area A of FIG. 3 together.

Referring to FIGS. 3 to 6, in an embodiment, the first electrode patterns IE1-1 to IE1-5 and the second electrode patterns IE2-1 to IE2-4 may have a mesh structure. In an embodiment, for example, as shown in FIGS. 4 and 6, the mesh structure may be provided with at least one mesh hole. In such an embodiment, the first sensing parts SP1 of the first electrode patterns IE1-1 to IE1-5 and the second sensing parts SP2 of the second electrode patterns IE2-1 to IE2-4 may define mesh holes MH1, MH2, and MH3. In an embodiment, the mesh holes MH1, MH2, and MH3 may have a rectangular planar shape, but the invention is not necessarily limited thereto.

In such an embodiment, since the first electrode patterns IE1-1 to IE1-5 and the second electrode patterns IE2-1 to IE2-4 have a mesh structure, parasitic capacitance with the electrodes of the display panel DP may be reduced.

In an embodiment, as shown in FIGS. 4 and 5, the first electrode patterns IE1-1 to IE1-5 (i.e., the first sensing parts SP1) and the second electrode patterns IE2-1 to IE2-4 (i.e., the second sensing parts SP2) may be spaced apart from the light emitting area EA. In such an embodiment, the first electrode patterns IE1-1 to IE1-5 and the second electrode patterns IE2-1 to IE2-4 may not overlap the light emitting area EA in a plan view (i.e., when viewed in a thickness direction of the substrate SUB or the third direction DR3). That is, the first electrode patterns IE1-1 to IE1-5 and the second electrode patterns IE2-1 to IE2-4 may overlap the non-emission area NEA in a plan view.

Here, the light emitting area EA may be an area where light is emitted, and may be included in each of the pixels PX (or pixel areas in which the pixels PX are disposed) described with reference to FIG. 2. The non-emission area NEA may be an area in which no light is emitted and may surround the light emitting area EA. Accordingly, the first electrode patterns IE1-1 to IE1-5 and the second electrode patterns IE2-1 to IE2-4 may not be visually recognized by the user of the display device DD.

In an embodiment, the light emitting area EA may include a plurality of light emitting areas according to color of light generated from the light emitting element. In an embodiment, for example, as shown in FIGS. 4 to 6, the light emitting area EA may include a first light emitting area EA1, a second light emitting area EA2, and a third light emitting area EA3 that emit light of different colors, respectively.

The mesh holes MH1, MH2, and MH3 may be divided into a plurality of groups having different areas from each other. In an embodiment, for example, the mesh holes MH1, MH2, and MH3 may be divided into three groups according to corresponding light emitting areas EA1, EA2, and EA3.

In an embodiment, as shown in FIGS. 4 and 6, the mesh holes MH1, MH2, and MH3 correspond to the light emitting areas EA1, EA2, and EA3 one-to-one, but the invention is not necessarily limited thereto. In an embodiment, for example, at least one mesh hole among the mesh holes MH1, MH2, and MH3 may correspond to two or more light emitting areas.

In an embodiment, as shown in FIGS. 4 and 6, areas (or sizes) of the first to third light emitting areas EA1, EA2, and EA3 may be different from each other, but the invention is not necessarily limited thereto. In an embodiment, for example, the first to third light emitting areas EA1, EA2, and EA3 may have a same area (or size) as each other, and accordingly, the mesh holes MH1, MH2, and MH3 may have a same area (or size) as each other.

In an embodiment, an arrangement structure of the first light emitting area EA1, the second light emitting area EA2, and the third light emitting area EA3 may be an S-stripe structure. In an embodiment, for example, the first light emitting area EA1 and the second light emitting area EA2 may be disposed in a first column, and the third light emitting area EA3 may be disposed in a second column adjacent to the first column. However, the invention is not necessarily limited thereto, and in an alternative embodiment, the arrangement structure of the first light emitting area EA1, the second light emitting area EA2, and the third light emitting area EA3 may be a diamond structure or pentile structure.

In an embodiment, as shown in FIGS. 4 and 6, the input sensing layer ISL may further include at least one dummy electrode pattern DUM. The dummy electrode pattern DUM may be disconnected from the first electrode patterns IE1-1 to IE1-5 and the second electrode patterns IE2-1 to IE2-4. In an embodiment, for example, the dummy electrode pattern DUM may be disposed between the first electrode patterns IE1-1 to IE1-5 and the second electrode patterns IE2-1 to IE2-4. In such an embodiment, the dummy electrode pattern DUM may be disposed between the first sensing parts SP1 and the second sensing parts SP2.

In an embodiment, the dummy electrode pattern DUM may include a same material as the first electrode patterns IE1-1 to IE1-5 and the second electrode patterns IE2-1 to IE2-4. In an embodiment, for example, the dummy electrode pattern DUM may include a metal material. In such an embodiment, the dummy electrode pattern DUM may include molybdenum (Mo), aluminum (Al), titanium (Ti), copper (Cu), or the like.

In an embodiment, the dummy electrode pattern DUM may have a multi-layered structure further including molybdenum-tantalum oxide (MTO). In an embodiment, for example, the dummy electrode pattern DUM may have a three-layer structure such as MTO/Mo/MTO, MTO/Cu/MTO, or MTO/Al/MTO. Alternatively, the dummy electrode pattern DUM may have a two-layer structure such as MTO/Mo, MTO/Cu, or MTO/Al.

In an embodiment, for example, the dummy electrode pattern DUM may be formed together with the first electrode patterns IE1-1 to IE1-5 and the second electrode patterns IE2-1 to IE2-4 in a process of forming the first electrode patterns IE1-1 to IE1-5 and the second electrode patterns IE2-1 to IE2-4.

As shown in FIGS. 5 and 6, in an embodiment, the input sensing layer ISL may further include at least one light control pattern LCP. In an embodiment, the light control patterns LCP may be arranged side by side with each other in a plan view. In an embodiment, for example, the light control patterns LCP may be parallel to each other. However, an arrangement of the light control patterns LCP is not necessarily limited thereto.

The light control patterns LCP may control viewing angle of light emitted from the first to third light emitting areas EA1, EA2, and EA3. In an embodiment, the light control patterns LCP may be arranged to overlap the first to third light emitting areas EA1, EA2, and EA3.

In an embodiment, the light control patterns LCP may include a same material as the first electrode patterns IE1-1 to IE1-5, the second electrode patterns IE2-1 to IE2-4, and the dummy electrode pattern DUM. In an embodiment, for example, the light control patterns LCP may include a metal material. In such an embodiment, the light control patterns LCP may include molybdenum (Mo), aluminum (Al), titanium (Ti), copper (Cu), or the like.

In an embodiment, the light control patterns LCP may have a multi-layered structure further including molybdenum-tantalum oxide (MTO). In an embodiment, for example, the light control patterns LCP may have a three-layer structure such as MTO/Mo/MTO, MTO/Cu/MTO, or MTO/Al/MTO. Alternatively, the light control patterns LCP may have a two-layer structure such as MTO/Mo, MTO/Cu, or MTO/Al.

Some of the light control patterns LCP may be directly connected to (or directly contact) the first electrode patterns IE1-1 to IE1-5, others of the light control patterns LCP may be directly connected to the second electrode patterns IE2-1 to IE2-4, and the others of the light control patterns LCP may be directly connected to the dummy electrode pattern DUM. Accordingly, floating of the light control patterns LCP may be substantially reduced or effectively prevented. Also, an occurrence of a phenomenon in which the light control patterns LCP is separated from underlying structures (e.g., an encapsulation layer ENC) may be substantially reduced or effectively prevented. Accordingly, driving efficiency and structural reliability of the display device DD may be improved.

In an embodiment, for example, some of the light control patterns LCP may be integrally formed with the first electrode patterns IE1-1 to IE1-5 as a single unitary and indivisible part, others may be integrally formed with the second electrode patterns IE2-1 to IE2-4 as a single unitary and indivisible part, and the others may be integrally formed with the dummy electrode pattern DUM as a single unitary and indivisible part.

Figure 7:
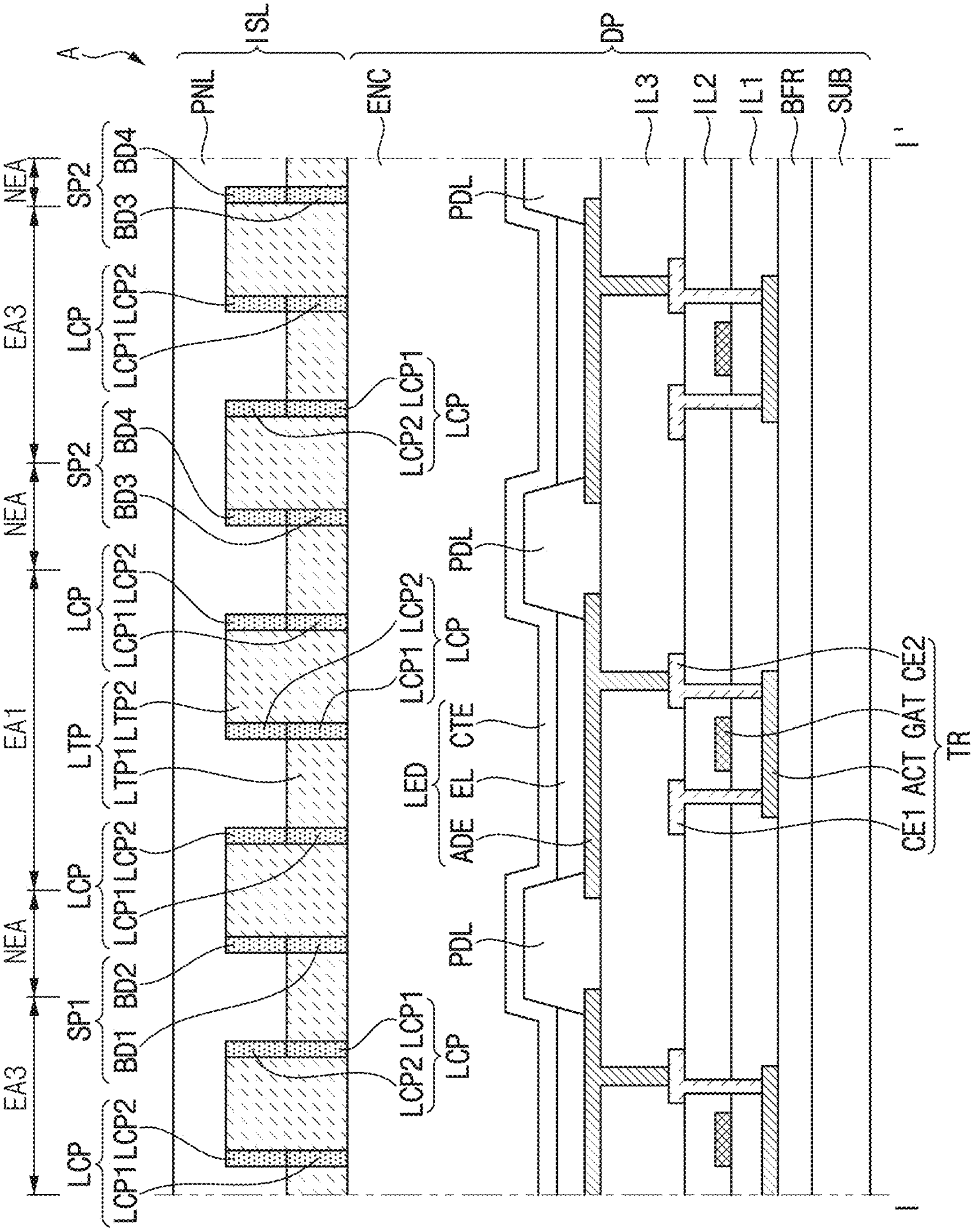
FIG. 7 is a cross-sectional view taken along line I-I' in FIG. 6.
Figure 8:
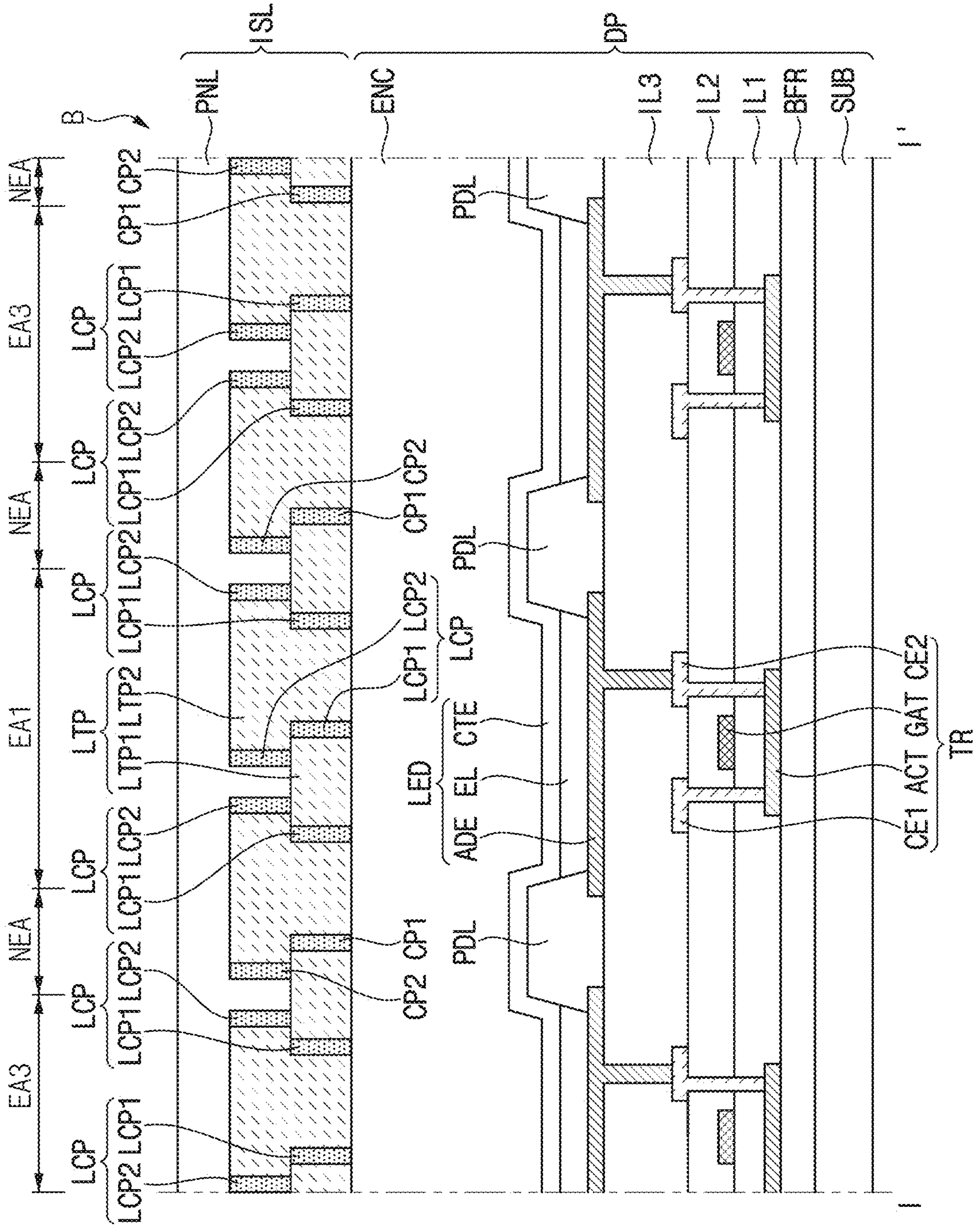
FIG. 8 is a cross-sectional view illustrating area B in FIG. 3 according to an embodiment.

FIG. 7 is a cross-sectional view taken along line I-I' in FIG. 6, and FIG. 8 is a cross-sectional view illustrating area B in FIG. 3 according to an embodiment.

In FIGS. 7 and 8, only cross-sectional structures of the first light emitting area EA1 and the third light emitting area EA3 are shown for convenience of illustration and description. Cross-sectional structures of the first light-emitting area EA1 and the third light-emitting area EA3 may be substantially the same as each other, and cross-sectional structure of the second light emitting area EA2 may be substantially the same as the first light emitting area EA1 and the third light emitting area EA3.

Referring to FIGS. 4 to 8, an embodiment of the display device DD may include the display panel DP and the input sensing layer ISL.

The display panel DP may include a substrate SUB, a buffer layer BFR, a driving element TR, a plurality of insulating layers IL1, IL2, and IL3, a pixel defining layer PDL, a light emitting element LED, and an encapsulation layer ENC. The driving element TR may include an active pattern ACT, a gate electrode GAT, a first connection electrode CE1 and a second connection electrode CE2. The light emitting element LED may include a pixel electrode ADE, a light emitting layer EL, and a common electrode CTE.

The substrate SUB may include a transparent or opaque material. In an embodiment, examples of materials that can be used as the substrate SUB may include glass, quartz, plastic, or the like. These may be used alone or in combination with each other.

The buffer layer BFR may be disposed on the substrate SUB. The buffer layer BFR may effectively prevent diffusion of impurities such as oxygen, moisture, or the like to an upper portion of the substrate SUB through the substrate SUB. The buffer layer BFR may include an inorganic insulating material such as a silicon compound or a metal oxide.

The active pattern ACT may be disposed on the buffer layer BFR. In an embodiment, the active pattern ACT may include a silicon semiconductor material or an oxide semiconductor material.

In an embodiment, the first insulating layer IL1 may be disposed on the buffer layer BFR. The first insulating layer IL1 may cover the active pattern ACT. In an alternative embodiment, the first insulating layer IL1 may be disposed in a pattern shape on the active pattern ACT to expose a portion of the active pattern ACT. In an embodiment, for example, the first insulating layer IL1 may be disposed on the active pattern ACT in a pattern shape to overlap the gate electrode GAT. The first insulating layer IL1 may include an inorganic insulating material.

The gate electrode GAT may be disposed on the first insulating layer IL1. In an embodiment, the gate electrode GAT may include a metal, an alloy, a conductive metal oxide, a transparent conductive material, or the like.

The second insulating layer IL2 may be disposed on the first insulating layer IL1. In an embodiment, the second insulating layer IL2 may cover the gate electrode GAT. The second insulating layer IL2 may include an inorganic insulating material.

The first connection electrode CE1 and the second connection electrode CE2 may be disposed on the second insulating layer IL2. The first connection electrode CE1 and the second connection electrode CE2 may be electrically connected to the active pattern ACT through a contact hole defined or formed in the second insulating layer IL2. Each of the first connection electrode CE1 and the second connection electrode CE2 may include a metal, an alloy, a conductive metal oxide, a transparent conductive material, or the like.

The third insulating layer IL3 may be disposed on the second insulating layer IL2. The third insulating layer IL3 may cover the first connection electrode CE1 and the second connection electrode CE2. The third insulating layer IL3 may include an organic insulating material.

Here, configuration, arrangement, and connection structure of each of the driving element TR and the plurality of insulating layers IL1, IL2, and IL3 described with reference to FIG. 7 are only example and may be variously changed or modified according to embodiments.

The pixel electrode ADE may be disposed on the third insulating layer IL3. The pixel electrode ADE may be electrically connected to the driving element TR through a contact hole defined or formed in the third insulating layer IL3. In an embodiment, the pixel electrode ADE may include a metal, an alloy, a conductive metal oxide, a transparent conductive material, or the like.

The pixel defining layer PDL may be disposed on the third insulating layer IL3. The pixel defining layer PDL may define a pixel opening exposing a portion of the pixel electrode ADE. In an embodiment, the pixel defining layer PDL may include an organic insulating material.

The light emitting layer EL may be disposed on the pixel electrode ADE in the pixel opening. The light emitting layer EL may include a material which emits light. In an embodiment, for example, the light emitting layer EL may include an organic light emitting material.

In an embodiment, functional layers such as a hole injection layer, a hole transport layer, an electron transport layer, and an electron injection layer may be additionally disposed above and/or below the light emitting layer EL.

The common electrode CTE may be disposed on the light emitting layer EL. The common electrode CTE may include a conductive material such as a metal, an alloy, a conductive metal nitride, a conductive metal oxide, or a transparent conductive material. In an embodiment, the common electrode CTE may continuously extend over a plurality of pixels.

The pixel electrode ADE, the light emitting layer EL, and the common electrode CTE may define the light emitting element LED. Areas where the light emitting element LED is defined may include the first light emitting area EA1 and the third light emitting area EA3 described with reference to FIGS. 4 to 8. In an embodiment, each of the first light emitting area EA1 and the third light emitting area EA3 may be an area corresponding to the pixel opening.

The encapsulation layer ENC may be disposed on the light emitting element LED. The encapsulation layer ENC may protect the light emitting element LED from external moisture, heat, shock, or the like. Although not shown, the encapsulation layer ENC may include a first inorganic encapsulation layer, an organic encapsulation layer disposed on the first inorganic encapsulation layer, and a second inorganic encapsulation layer disposed on the organic encapsulation layer.

The input sensing layer ISL may be disposed on the display panel DP. The input sensing layer ISL may include light transmission patterns LTP, the light control patterns LCP, the first sensing parts SP1, the second sensing parts SP2, the first connection parts CP1, and the second connection parts CP2, and a planarization layer PNLPNL.

The light transmission patterns LTP may be disposed on the encapsulation layer ENC. The light transmission patterns LTP may include a first light transmission pattern LTP1 and a second light transmission pattern LTP2.

In an embodiment, the first light transmission pattern LTP1 may be disposed on the encapsulation layer ENC. The first light transmission pattern LTP1 may define a first opening exposing an upper surface of the encapsulation layer ENC. The first opening may be defined from a side surface of the first light transmission pattern LTP1. In other words, the first opening may be defined through the first light transmission pattern LTP1. In an embodiment, the first light transmission pattern LTP1 may have a grid shape in a plan view.

In an embodiment, the second light transmission pattern LTP2 may be disposed in the first opening of the first light transmission pattern LTP1. In an embodiment, the second light transmission pattern LTP2 may have a higher height than the first light transmission pattern LTP1. Accordingly, a portion of the side surface of the second light transmission pattern LTP2 may be exposed from the first light transmission pattern LTP1.

The second light transmission pattern LTP2 may define a second opening exposing at least a portion of an upper surface of the first light transmission pattern LTP1. The second opening may be defined from a portion of the side surface of the second light transmission pattern LTP2. In an embodiment, the second light transmission pattern LTP2 may have a grid shape in a plan view.

The first light transmission pattern LTP1 and the second light transmission pattern LTP2 may include an organic insulating material and/or an inorganic insulating material having relatively high light transmittance. In an embodiment, for example, the first light transmission pattern LTP1 and the second light transmission pattern LTP2 may include a transparent material such as an epoxy resin, a siloxane resin, a polyimide resin, or a photoresist.

The light control patterns LCP may be disposed on the encapsulation layer ENC. The light control patterns LCP may include first light control patterns LCP1 and second light control patterns LCP2.

The first light control patterns LCP1 may be disposed in the first opening defined in the first light transmission pattern LTP1. In an embodiment, for example, the first light control patterns LCP1 may surround at least a portion of a side surface of the first light transmission pattern LTP1.

The second light control patterns LCP2 may be disposed in the second opening defined in the second light transmission pattern LTP2. In an embodiment, for example, the second light control patterns LCP2 may surround at least a portion of the side surface of the second light transmission pattern LTP2.

Each of the first light control patterns LCP1 and the second light control patterns LCP2 may include a metal material. In an embodiment, for example, each of the first light control patterns LCP1 and the second light control patterns LCP2 may include molybdenum (Mo), aluminum (Al), titanium (Ti), copper (Cu), or the like.

In an embodiment, each of the first light control patterns LCP1 and the second light control patterns LCP2 may have a multi-layered structure further including molybdenum-tantalum oxide (MTO). In an embodiment, for example, each of the first light control patterns LCP1 and the second light control patterns LCP2 may have a three-layer structure such as MTO/Mo/MTO, MTO/Cu/MTO, or MTO/Al/MTO. Alternatively, each of the first light control patterns LCP1 and the second light control patterns LCP2 may have a two-layer structure such as MTO/Mo, MTO/Cu, or MTO/Al.

In an embodiment, as shown in FIG. 8, the first light control patterns LCP1 and the second light control patterns LCP2 located in the area B of FIG. 3 may be spaced apart from each other. In such an embodiment, the first light control patterns LCP1 and the second light control patterns LCP2 disposed in the area where the connection parts CP1 and CP2 are located may be spaced apart from each other. However, the invention is not necessarily limited thereto, in an alternative embodiment, the first light control patterns LCP1 and the second light control patterns LCP2 may contact each other in the area B of FIG. 3. That is, in the area B of FIG. 3, the first light control patterns LCP1 and the second light control patterns LCP2 may not be spaced apart from each other.

In an embodiment, as shown in FIG. 7, the first sensing parts SP1 may include a first body part BD1 disposed on the encapsulation layer ENC and a second body part BD2 disposed on the first body part BD1. The first body part BD1 and the second body part BD2 may have a mesh structure. That is, the first sensing parts SP1 may include two layers having a mesh structure.

In an embodiment, the first body part BD1 and the second body part BD2 may contact each other. Accordingly, the first body part BD1 and the second body part BD2 may be electrically connected to each other. The first body part BD1 and the second body part BD2 may be electrically connected to the corresponding first touch signal lines SL1-1 to SL1-5 (see FIG. 3).

The first body part BD1 may be disposed in the first opening defined in the first light transmission pattern LTP1. In an embodiment, for example, the first body part BD1 may surround at least a portion of the side surface of the first light transmission pattern LTP1.

In an embodiment, the first body part BD1 may include a same material as the first light control patterns LCP1. In an embodiment, the first body part BD1 may include a metal material. In an embodiment, for example, the first body part BD1 may include molybdenum (Mo), aluminum (Al), titanium (Ti), copper (Cu), or the like.

In an embodiment, the first body part BD1 may have a multi-layered structure further including molybdenum-tantalum oxide (MTO). In an embodiment, for example, the first body part BD1 may have a three-layer structure such as MTO/Mo/MTO, MTO/Cu/MTO, or MTO/Al/MTO. Alternatively, the first body part BD1 may have a two-layer structure such as MTO/Mo, MTO/Cu, or MTO/Al.

In an embodiment, the first body part BD1 may be directly connected to the first light control patterns LCP1. In an embodiment, for example, the first body part BD1 may be integrally formed with at least a portion of the first light control patterns LCP1 as a single unitary and indivisible part.

The second body part BD2 may be disposed in the second opening defined in the second light transmission pattern LTP2. In an embodiment, for example, the second body part BD2 may surround at least a portion of the side surface of the second light transmission pattern LTP2.

In an embodiment, the second body part BD2 may include a same material as the second light control patterns LCP2. In an embodiment, the second body part BD2 may include a metal material. In an embodiment, for example, the second body part BD2 may include molybdenum (Mo), aluminum (Al), titanium (Ti), copper (Cu), or the like.

In an embodiment, the second body part BD2 may have a multi-layered structure further including molybdenum-tantalum oxide (MTO). In an embodiment, for example, the second body part BD2 may have a three-layer structure such as MTO/Mo/MTO, MTO/Cu/MTO, or MTO/Al/MTO. Alternatively, the second body part BD2 may have a two-layer structure such as MTO/Mo, MTO/Cu, or MTO/Al.

In an embodiment, the second body part BD2 may be directly connected to the second light control patterns LCP2. In an embodiment, for example, the second body BD2 may be integrally formed with at least a portion of the second light control patterns LCP2 as a single unitary and indivisible part.

In an embodiment, as shown in FIG. 7, the second sensing parts SP2 may include a third body part BD3 disposed on the encapsulation layer ENC and a fourth body part BD4 disposed on the third body part BD3. The third body part BD3 and the fourth body part BD4 may have a mesh structure. That is, the second sensing parts SP2 may include two layers having a mesh structure.

In an embodiment, the third body part BD3 and the fourth body part BD4 may contact each other. Accordingly, the third body part BD3 and the fourth body part BD4 may be electrically connected to each other. The third body part BD3 and the fourth body part BD4 may be electrically connected to the corresponding second touch signal lines SL2-1 to SL2-4 (see FIG. 3).

The third body part BD3 may be disposed in the first opening defined in the first light transmission pattern LTP1. In an embodiment, for example, the third body part BD3 may surround at least a portion of a side surface of the first light transmission pattern LTP1.

In an embodiment, the third body part BD3 may include a same material as the first light control patterns LCP1. In an embodiment, the third body part BD3 may include a metal material. In an embodiment, for example, the third body part BD3 may include molybdenum (Mo), aluminum (Al), titanium (Ti), copper (Cu), or the like.

In an embodiment, the third body part BD3 may have a multi-layered structure further including molybdenum-tantalum oxide (MTO). In an embodiment, for example, the third body part BD3 may have a three-layer structure such as MTO/Mo/MTO, MTO/Cu/MTO, or MTO/Al/MTO. Alternatively, the third body part BD3 may have a two-layer structure such as MTO/Mo, MTO/Cu, or MTO/Al.

In an embodiment, the third body part BD3 may be directly connected to the first light control patterns LCP1. In an embodiment, for example, the third body part BD3 may be integrally formed with at least a portion of the first light control patterns LCP1 as a single unitary and indivisible part.

The fourth body part BD4 may be disposed in the second opening defined in the second light transmission pattern LTP2. In an embodiment, for example, the fourth body part BD4 may surround at least a portion of a side surface of the second light transmission pattern LTP2.

In an embodiment, the fourth body part BD4 may include a same material as the second light control patterns LCP2. In an embodiment, the fourth body part BD4 may include a metal material. In an embodiment, for example, the fourth body part BD4 may include molybdenum (Mo), aluminum (Al), titanium (Ti), copper (Cu), or the like.

In an embodiment, the fourth body part BD4 may have a multi-layered structure further including molybdenum-tantalum oxide (MTO). In an embodiment, for example, the fourth body part BD4 may have a three-layer structure such as MTO/Mo/MTO, MTO/Cu/MTO, or MTO/Al/MTO. Alternatively, the fourth body part BD4 may have a two-layer structure such as MTO/Mo, MTO/Cu, or MTO/Al.

In an embodiment, the fourth body part BD4 may be directly connected to the second light control patterns LCP2. In an embodiment, for example, the fourth body part BD4 may be integrally formed with at least a portion of the second light control patterns LCP2 as a single unitary and indivisible part.

In an embodiment, as shown in FIG. 8, the first connection parts CP1 may be disposed on the encapsulation layer ENC. In such an embodiment, the first connection parts CP1 may be disposed in the first opening defined in the first light transmission pattern LTP1. In an embodiment, for example, the first connection parts CP1 may surround at least a portion of the side surface of the first light transmission pattern LTP1.

In an embodiment, the first connection parts CP1 may include a same material as the first light control patterns LCP1. In an embodiment, the first connection parts CP1 may include a metal material. In an embodiment, for example, the first connection parts CP1 may include molybdenum (Mo), aluminum (Al), titanium (Ti), copper (Cu), or the like.

In an embodiment, the first connection parts CP1 may have a multi-layered structure further including molybdenum-tantalum oxide (MTO). In an embodiment, for example, the first connection parts CP1 may have a three-layer structure such as MTO/Mo/MTO, MTO/Cu/MTO, or MTO/Al/MTO. Alternatively, the first connection parts CP1 may have a two-layer structure such as MTO/Mo, MTO/Cu, or MTO/Al.

In an embodiment, the first connection parts CP1 may be directly connected to the first light control patterns LCP1. In an embodiment, for example, the first connection parts CP1 may be integrally formed with at least a portion of the first light control patterns LCP1 as a single unitary and indivisible part.

In an embodiment, as shown in FIG. 8, the second connection parts CP2 may be disposed on the first connection parts CP1. In such an embodiment, the second connection parts CP2 may be disposed in the second openings defined in the second light transmission pattern LTP2. In an embodiment, for example, the second connection parts CP2 may surround at least a portion of the side surface of the second light transmission pattern LTP2.

In an embodiment, the first connection parts CP1 and the second connection parts CP2 may be spaced apart from each other. In such an embodiment, the first connection parts CP1 and the second connection parts CP2 may not overlap each other in a plan view. In an embodiment, for example, the first connection parts CP1 and the second connection parts CP2 may not contact each other.

In an embodiment, the second connection parts CP2 may include a same material as the second light control patterns LCP2. In an embodiment, the second connection parts CP2 may include a metal material. In an embodiment, for example, the second connection parts CP2 may include molybdenum (Mo), aluminum (Al), titanium (Ti), copper (Cu), or the like.

In an embodiment, the second connection parts CP2 may have a multi-layered structure further including molybdenum-tantalum oxide (MTO). In an embodiment, for example, the second connection parts CP2 may have a three-layer structure such as MTO/Mo/MTO, MTO/Cu/MTO, or MTO/Al/MTO. Alternatively, the second connection parts CP2 may have a two-layer structure such as MTO/Mo, MTO/Cu, or MTO/Al.

In an embodiment, the second connection parts CP2 may be directly connected to the second light control patterns LCP2. In an embodiment, for example, the second connection parts CP2 may be integrally formed with at least a portion of the second light control patterns LCP2 as a single unitary and indivisible part.

As a result, the side surface of the first light transmission pattern LTP1 may be surrounded by the first body part BD1 of the first sensing parts SP1, the third body part BD3 of the second sensing parts SP2, the first connection parts CP1, and the first light control patterns LCP1. In an embodiment, the first body part BD1 of the first sensing parts SP1, the third body part BD3 of the second sensing parts SP2, the first connection parts CP1, and the first light control patterns LCP1 may be directly connected to each other. In an embodiment, for example, the first body part BD1 of the first sensing parts SP1, the third body part BD3 of the second sensing parts SP2, the first connection parts CP1, and at least a portion of the first light control patterns LCP1 may be integrally formed as a single unitary and indivisible part.

In addition, the side surface of the second light transmission pattern LTP2 may be surrounded by the second body part BD2 of the first sensing parts SP1, the fourth body part BD4 of the second sensing parts SP2, the second connection parts CP2, and the second light control patterns LCP2. In an embodiment, the second body part BD2 of the first sensing parts SP1, the fourth body part BD4 of the second sensing parts SP2, the second connection parts CP2, and the second light control patterns LCP2 may be directly connected to each other. In an embodiment, for example, the second body part BD2 of the first sensing parts SP1, the fourth body part BD4 of the second sensing parts SP2, the second connection parts CP2, and at least of a portion of the second light control pattern LCP2 may be integrally formed as a single unitary and indivisible part.

The planarization layer PNL may cover the light transmission pattern LTP, the light control patterns LCP, the sensing parts SP1 and SP2, and the connection parts CP1 and CP2. The planarization layer PNL may have a substantially flat upper surface. The planarization layer PNL may be disposed while filling an empty space of the second opening of the second light transmission pattern LTP2.

According to embodiments, the input sensing layer ISL may include the light transmission pattern LTP, the light control pattern LCP, the first electrode pattern operating as a sensing electrode (Rx) when external input is sensed, and the second electrode pattern operating as a driving electrode (Tx) when external input is sensed. In addition, the light control pattern LCP, the first electrode pattern, and the second electrode pattern may be arranged to surround a side surface of the light transmission pattern LTP. Accordingly, an external input such as a touch or approach by an external medium may be sensed and a viewing angle of light emitted from the light emitting area may be controlled through the input sensing layer ISL. Accordingly, the display device DD may not separately include a functional layer for sensing an external input and a functional layer for controlling a viewing angle. Accordingly, a stacked structure of the display device DD may be simplified and efficiency of the manufacturing process of the display device DD may be improved.

In such embodiments, the light control pattern LCP, the first electrode pattern, and the second electrode pattern may be directly connected to each other. Accordingly, floating of the light control pattern LCP may be substantially reduced or effectively prevented. In such embodiments, an occurrence of a phenomenon in which the light control pattern LCP is separated from underlying structures may be substantially reduced or effectively prevented. Accordingly, driving efficiency and structural reliability of the display device DD may be improved.

Figure 9:
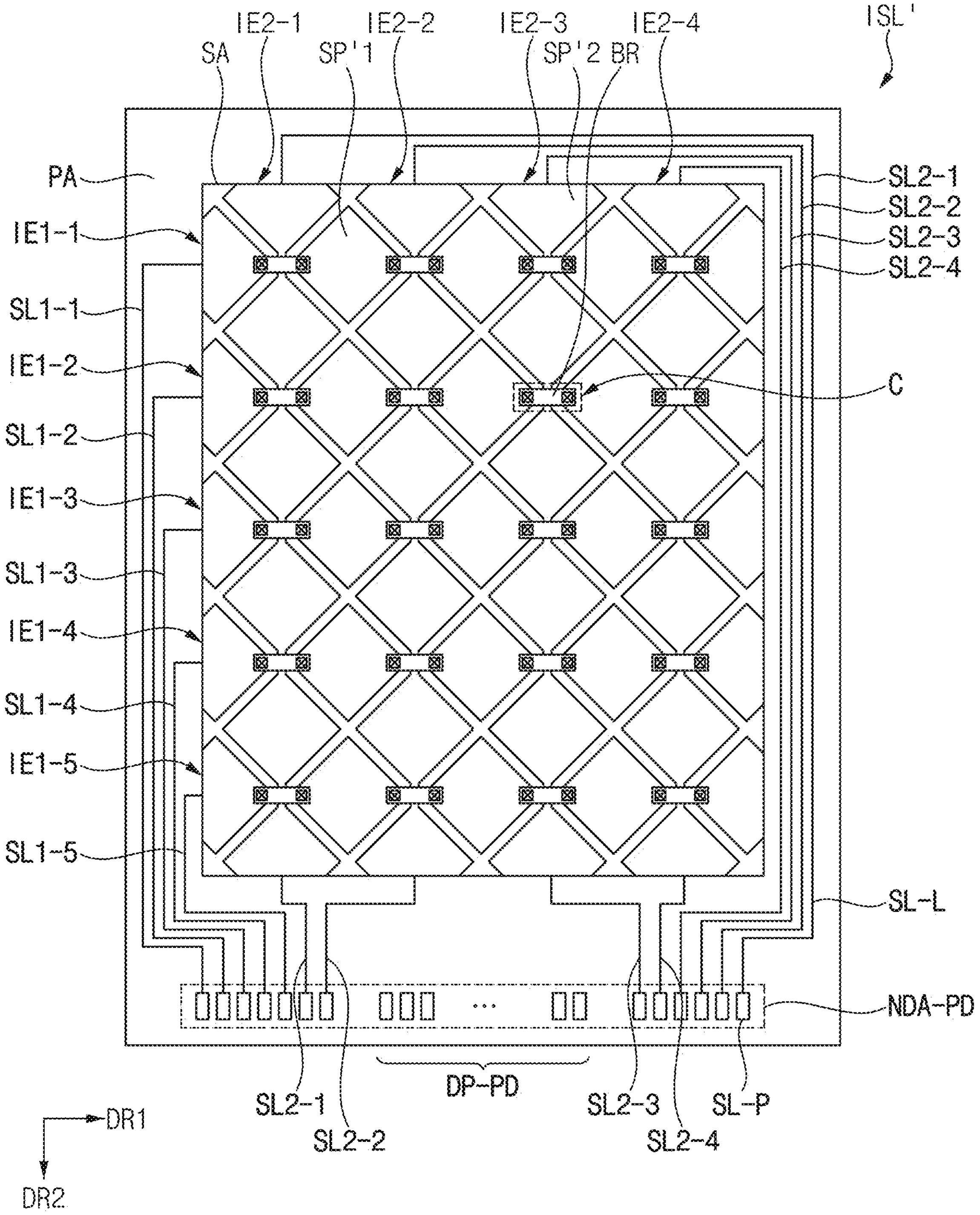
FIG. 9 is a plan view illustrating an input sensing layer according to an alternative embodiment.
Figure 10:
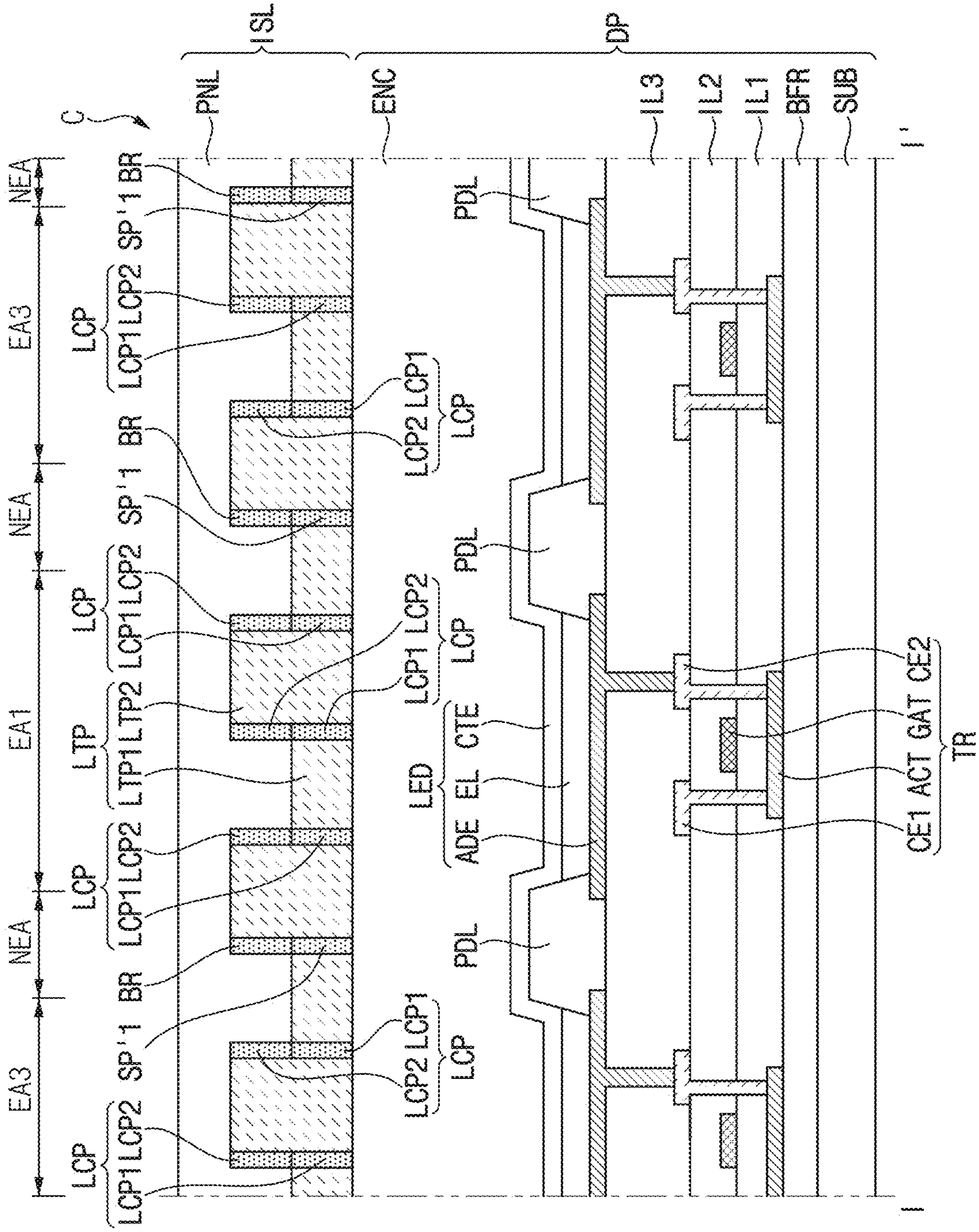
FIG. 10 is a cross-sectional view illustrating an area C of FIG. 9 according to an embodiment.

FIG. 9 is a plan view illustrating an input sensing layer according to an alternative embodiment, and FIG. 10 is a cross-sectional view illustrating an area C of FIG. 9 according to an embodiment.

Referring to. FIGS. 9 and 10, an input sensing layer ISL' according to an embodiment may include first sensing parts SP'1, second sensing parts SP'2, and a bridge electrode BR.

In such an embodiment, as described with reference to FIGS. 4 and 6, the first sensing parts SP'1 and the second sensing parts SP'2 may have a mesh structure. That is, each of the first sensing parts SP'1 and the second sensing parts SP'2 may include a body part having a mesh structure, and the mesh structure may define mesh holes.

In an embodiment, as shown in FIG. 10, the first sensing parts SP'1 (or the body part of the first sensing parts SP'1) may be disposed on the encapsulation layer ENC. In such an embodiment, the first sensing parts SP'1 (or the body part of the first sensing parts SP'1) may be disposed in the first opening defined in the first light transmission pattern LTP1. In an embodiment, for example, the first sensing parts SP'1 (or the body part of the first sensing parts SP'1) may surround at least a portion of the side surface of the first light transmission pattern LTP1.

In an embodiment, the first sensing parts SP'1 may be directly connected to the first light control patterns LCP1. In an embodiment, for example, the first sensing parts SP'1 may be integrally formed with at least a portion of the first light control patterns LCP1 as a single unitary and indivisible part.

In an embodiment, although not shown, the second sensing parts SP'2 (or the body part of the second sensing parts SP'2) may also be disposed on the encapsulation layer ENC. In such an embodiment, the second sensing parts SP'2 (or the body part of the second sensing parts SP'2) may be disposed in the first opening defined in the first light transmission pattern LTP1. In an embodiment, for example, the second sensing parts SP'2 (or the body part of the second sensing parts SP'2) may surround at least a portion of the side surface of the first light transmission pattern LTP1.

In an embodiment, the second sensing parts SP'2 may be directly connected to the first light control patterns LCP1. In an embodiment, for example, the second sensing parts SP'2 may be integrally formed with at least a portion of the first light control patterns LCP1 as a single unitary and indivisible part.

As shown in FIGS. 9 and 10, in an embodiment, the bridge electrode BR may be disposed on the first sensing parts SP'1. In such an embodiment, the bridge electrode BR may be disposed in the second openings defined in the second light transmission pattern LTP2. In an embodiment, for example, the bridge electrode BR may surround at least a portion of the side surface of the second light transmission pattern LTP2.

In an embodiment, the bridge electrode BR may be directly connected to the second light control patterns LCP2. In an embodiment, for example, the bridge electrode BR may be integrally formed with at least a portion of the second light control patterns LCP2 as a single unitary and indivisible part.

The bridge electrode BR may contact the first sensing parts SP'1. Accordingly, the bridge electrode BR may electrically connect the first sensing parts SP'1 spaced apart from each other.

In an embodiment, although not shown, the bridge electrode BR may also contact the second sensing parts SP'2. In such an embodiment, the bridge electrode BR may electrically connect the second sensing parts SP'2 spaced apart from each other.

Figure 11:
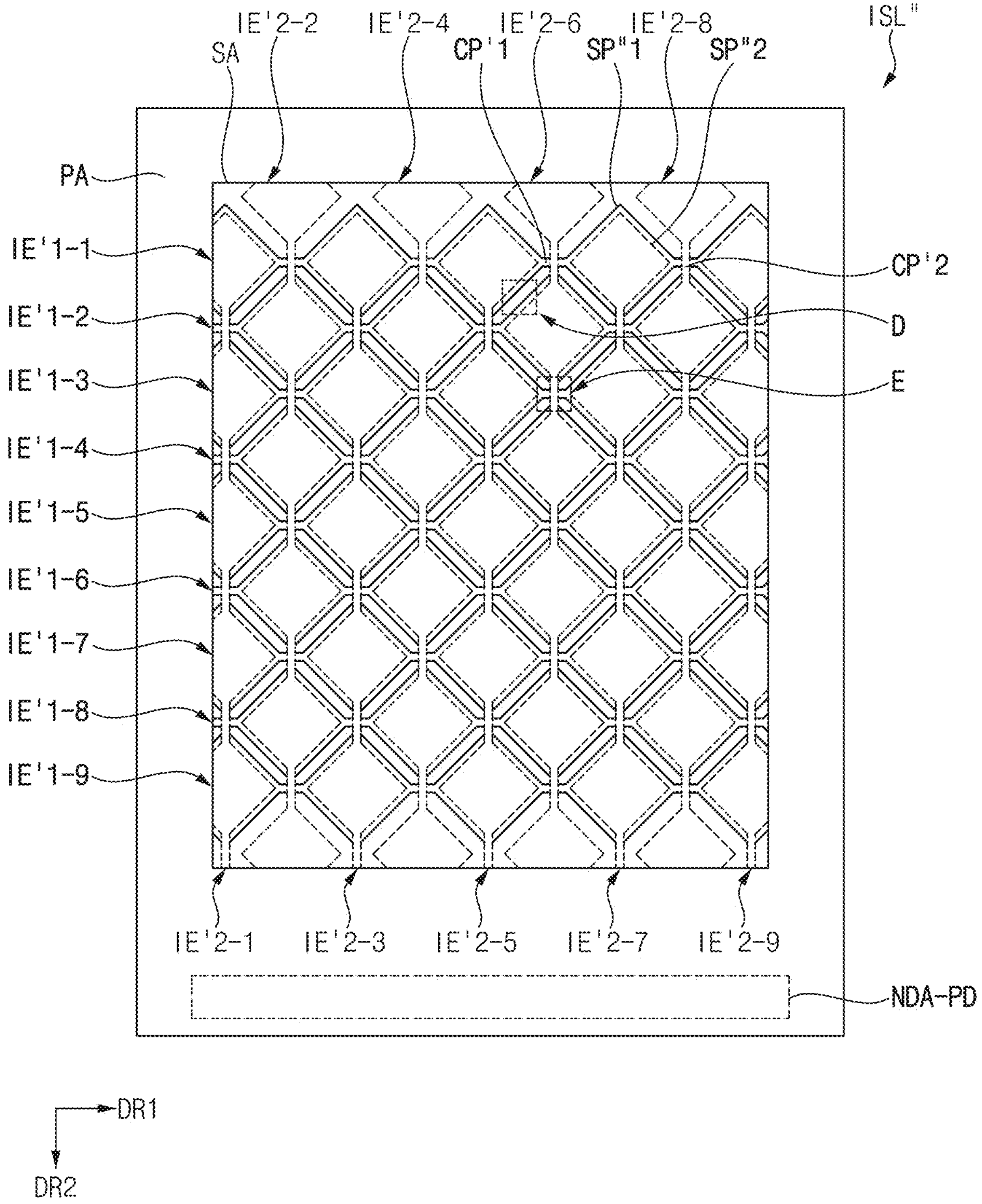
FIG. 11 is a plan view illustrating an input sensing layer according to another alternative embodiment.
Figure 12:
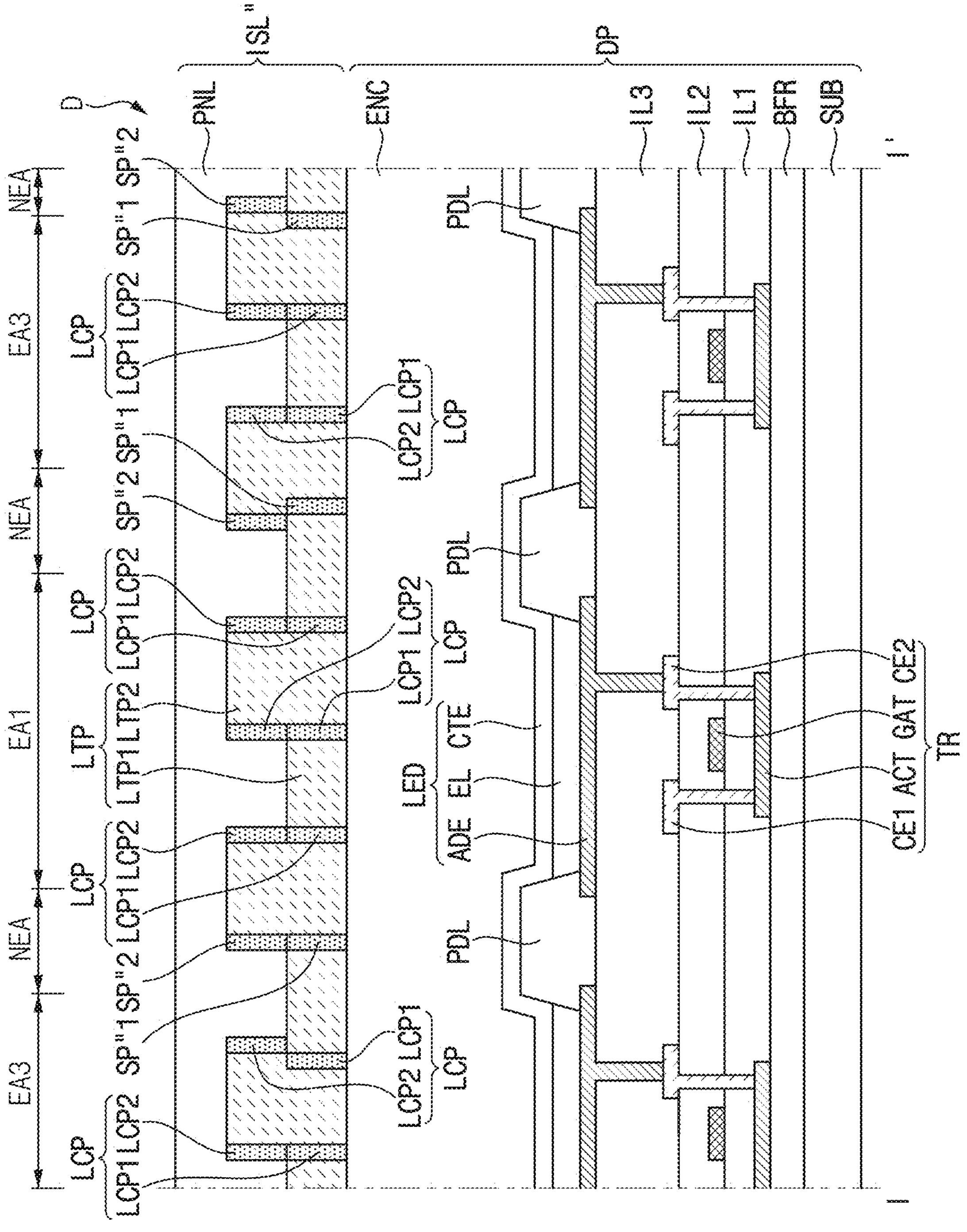
FIG. 12 is a cross-sectional view illustrating an area D of FIG. 11 according to an embodiment.
Figure 13:
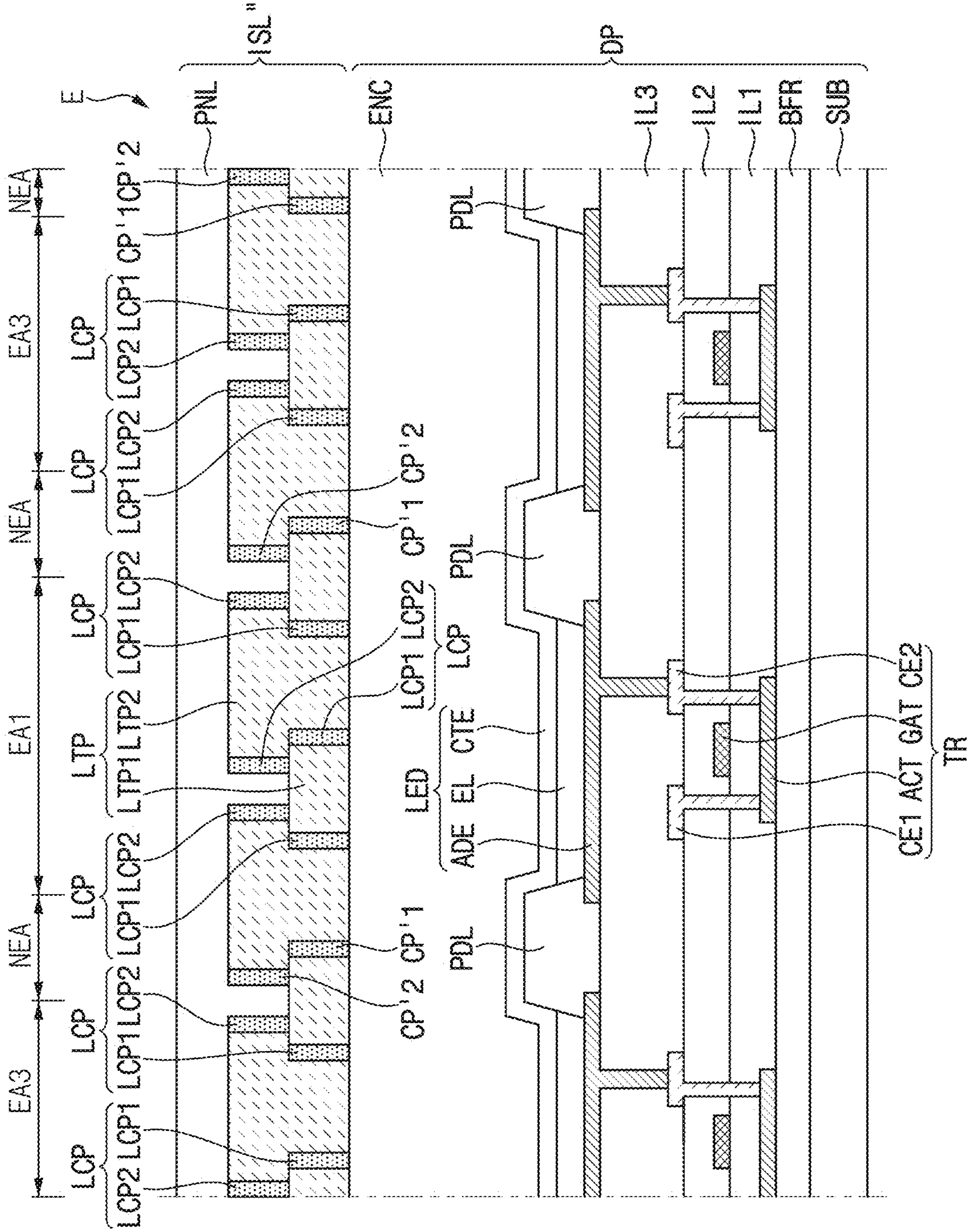
FIG. 13 is a cross-sectional view illustrating an area E of FIG. 11 according to an embodiment.

FIG. 11 is a plan view illustrating an input sensing layer according to another alternative embodiment, FIG. 12 is a cross-sectional view illustrating an area D of FIG. 11 according to an embodiment, and FIG. 13 is a cross-sectional view illustrating an area E of FIG. 11 according to an embodiment.

Referring to FIGS. 11 to 13, an input sensing layer ISL" according to an embodiment may be substantially the same as the input sense layer ISL described with reference to FIG. 3 except for arrangement of the first electrode patterns and the second electrode patterns. Therefore, any repetitive detailed descriptions thereof will be omitted or simplified.

In an embodiment, first electrode patterns IE'1-1 to IE'1-9 and second electrode patterns IE'2-1 to IE2'-9 may be disposed in (or directly on) different layers from each other. In an embodiment, for example, the second electrode patterns IE'2-1 to IE2'-9 may be disposed on the first electrode patterns IE'1-1 to IE'1-9.

Each of the first electrode patterns IE'1-1 to IE'1-9 may include first sensing parts SP"1 and first connection parts CP'1. In one first electrode pattern, the first sensing parts SP"1 may be arranged along the first direction DR1. Each of the first connection parts CP'1 may be connected between adjacent first sensing parts, which are neighboring each other, among the first sensing parts SP"1.

Each of the second electrode patterns IE'2-1 to IE'2-9 may include second sensing parts SP"2 and second connection parts CP'2. In one second electrode pattern, the second sensing parts SP"2 may be arranged along the second direction DR2. Each of the second connection parts CP'2 may be connected between adjacent second sensing parts, which are neighboring each other, among the second sensing parts SP"2.

In such an embodiment, as described with reference to FIGS. 4 and 6, the first sensing parts SP"1 and the second sensing parts SP"2 may have a mesh structure. That is, each of the first sensing parts SP"1 and the second sensing parts SP"2 includes a body part having a mesh structure, and the mesh structure may define mesh holes.

In an embodiment, the first electrode patterns IE'1-1 to IE'1-9 may operate as a sensing electrode (Rx) when external input is sensed, and the second electrode patterns IE'2-1 to IE2'-9 may operate as a driving electrode (Tx) when external input is sensed.

In an embodiment, as shown in FIG. 11, the input sensing layer ISL' includes nine first electrode patterns IE'1-1 to IE'1-9 and nine second electrode patterns IE'2-1 to IE2, but the invention is not necessarily limited thereto. In an alternative embodiment, for example, the input sensing layer ISL' may include 8 or less or 10 or more first electrode patterns, or may include 8 or less or 10 or more second electrode patterns.

In an embodiment, as shown in FIG. 12, the first sensing parts SP"1 (or the body part of the first sensing parts SP"1) may be disposed on the encapsulation layer ENC. Specifically, the first sensing parts SP"1 (or the body part of the first sensing parts SP"1) may be disposed in the first opening defined in the first light transmission pattern LTP1. In an embodiment, for example, the first sensing parts SP"1 (or the body part of the first sensing parts SP"1) may surround at least a portion of the side surface of the first light transmission pattern LTP1.

In an embodiment, the first sensing parts SP"1 may be directly connected to the first light control patterns LCP1. In an embodiment, for example, the first sensing parts SP"1 may be integrally formed with at least a portion of the first light control patterns LCP1 as a single unitary and indivisible part.

In an embodiment, as shown in FIG. 12, the second sensing parts SP"2 may be disposed on the first sensing parts SP"1. In such an embodiment, the second sensing parts SP"2 (or the body part of the second sensing parts SP"2) may be disposed in the second opening defined in the second light transmission pattern LTP2. In an embodiment, for example, the second sensing parts SP"2 (or the body part of the second sensing parts SP"2) may surround at least a portion of the side surface of the second light transmission pattern LTP2.

In an embodiment, the second sensing parts SP"2 may be directly connected to the second light control patterns LCP2. In an embodiment, for example, the second sensing parts SP"2 may be integrally formed with at least a portion of the second light control patterns LCP2 as a single unitary and indivisible part.

In an embodiment, the first sensing parts SP"1 (or the body part of the first sensing parts SP"1) and the second sensing parts SP"2 (or the body part of the second sensing parts SP"2) may be spaced apart from each other. In such an embodiment, the first sensing parts SP"1 (or the body part of the first sensing parts SP"1) and the second sensing parts SP"2 (or the body part of the second sensing parts SP"2) may not overlap each other in a plan view. In an embodiment, for example, the first sensing parts SP"1 (or the body part of the first sensing parts SP"1) and the second sensing parts SP"2 (or the body part of the second sensing parts SP"2) may not contact each other.

In an embodiment, as shown in FIG. 13, the first connection parts CP'1 may be disposed on the encapsulation layer ENC. In such an embodiment, the first connection parts CP'1 may be disposed in the first opening defined in the first light transmission pattern LTP1. In an embodiment, for example, the first connection parts CP'1 may surround at least a portion of the side surface of the first light transmission pattern LTP1.

In an embodiment, the first connection parts CP'1 may be directly connected to the first light control patterns LCP1. In an embodiment, for example, the first connection parts CP'1 may be integrally formed with at least a portion of the first light control patterns LCP1 as a single unitary and indivisible part.

In an embodiment, as shown in FIG. 13, the second connection parts CP'2 may be disposed on the first connection parts CP'1. In such an embodiment, the second connection parts CP'2 may be disposed in the second opening defined in the second light transmission pattern LTP2. In an embodiment, for example, the second connectors CP'2 may surround at least a portion of the side surface of the second light transmission pattern LTP2.

In an embodiment, the first connection parts CP'1 and the second connection parts CP'2 may be spaced apart from each other. In such an embodiment, the first connection parts CP'1 and the second connection parts CP'2 may not overlap each other in a plan view. In an embodiment, for example, the first connection parts CP'1 and the second connection parts CP'2 may not contact each other.

In an embodiment, the second connection parts CP'2 may be directly connected to the second light control patterns LCP2. In an embodiment, for example, the second connection parts CP'2 may be integrally formed with at least a portion of the second light control patterns LCP2 as a single unitary and indivisible part.

In an embodiment, as shown in FIG. 13, the first light control patterns LCP1 and the second light control patterns LCP2 are spaced apart from each other in the area E of FIG. 11, but the invention is not necessarily limited thereto. In an alternative embodiment, in the area E of FIG. 11, the first light control patterns LCP1 and the second light control patterns LCP2 may contact each other. That is, in the area E of FIG. 11, the first light control patterns LCP1 and the second light control patterns LCP2 may not be spaced apart from each other.

Figure 14:
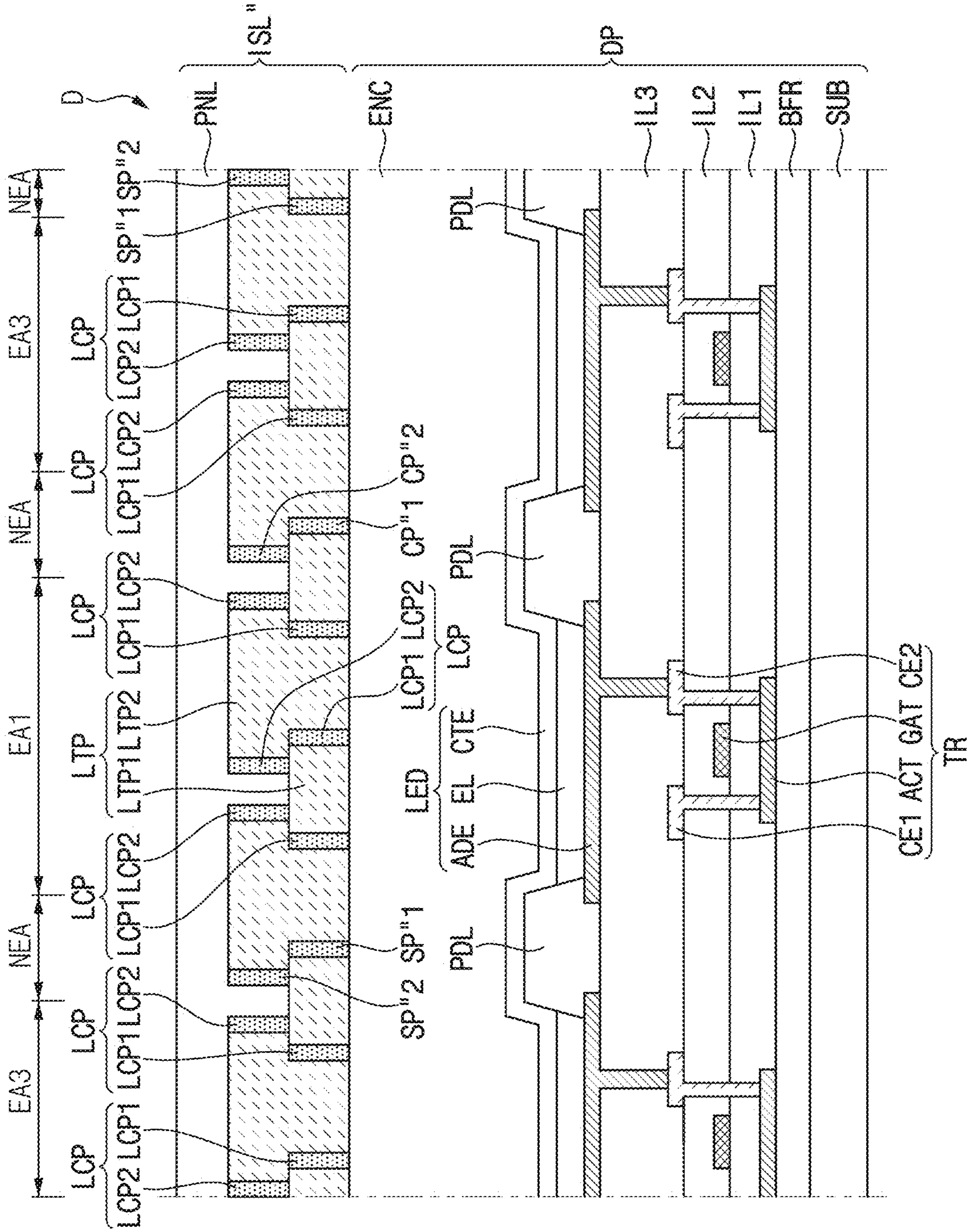
FIG. 14 is a cross-sectional view illustrating an area D of FIG. 11 according to an alternative embodiment.

FIG. 14 is a cross-sectional view illustrating an area D of FIG. 11 according to an alternative embodiment.

Referring to FIG. 14, in an embodiment, the first light control patterns LCP1 and the second light control patterns LCP2 located in the area D of FIG. 11 may be spaced apart from each other. In such an embodiment, the first light control patterns LCP1 and the second light control patterns LCP2 disposed in the area where the sensing parts SP"1 and SP"2 are located may be spaced apart from each other.

Figure 15:
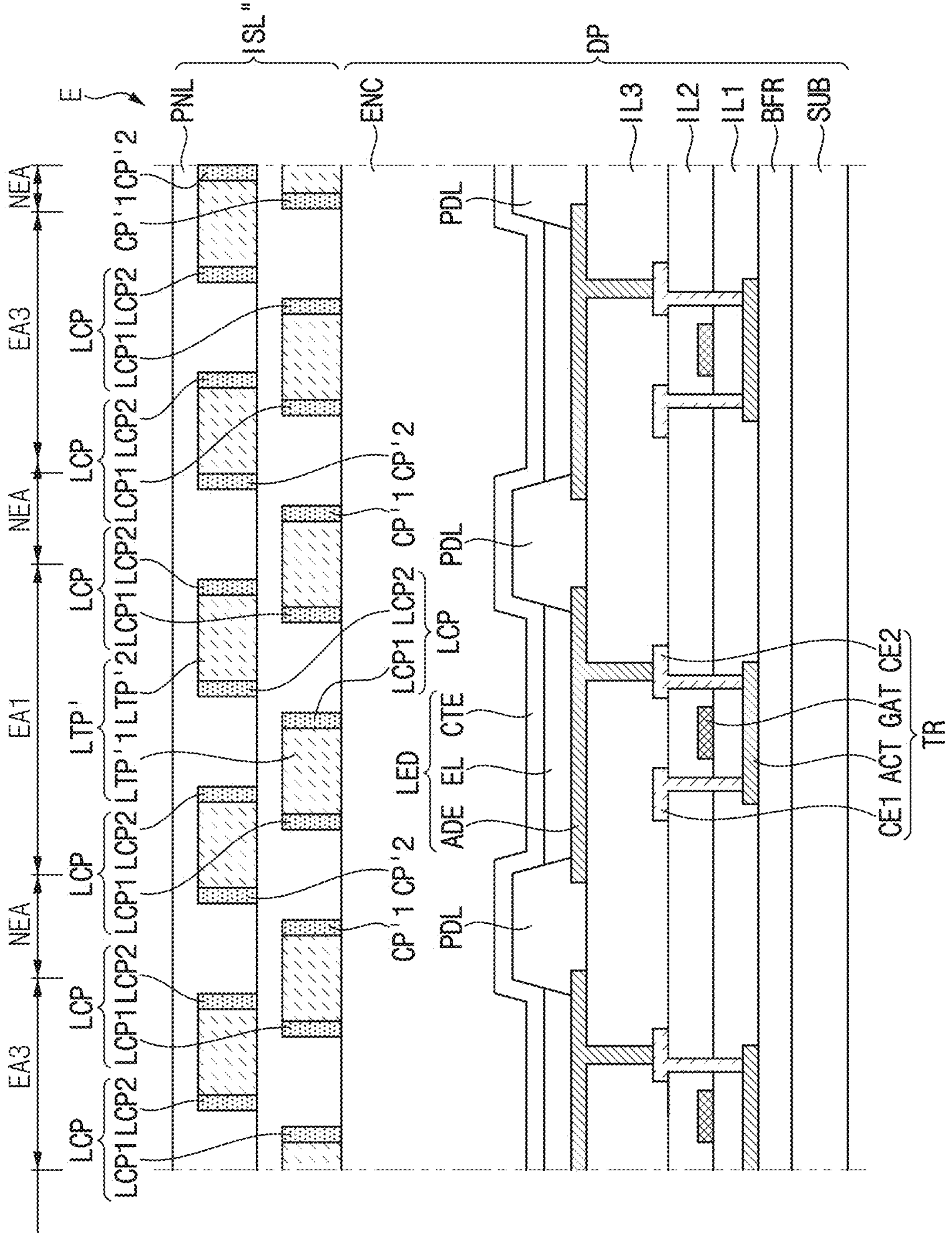
FIG. 15 is a cross-sectional view illustrating an area E of FIG. 11 according to an alternative embodiment.

FIG. 15 is a cross-sectional view illustrating an area E of FIG. 11 according to an alternative embodiment.

Referring to FIG. 15, in an embodiment, the input sensing layer ISL" may include a light transmission pattern LTP', a first planarization layer PNL1 and a second planarization layer PNL2. The light transmission pattern LTP' may include a first light transmission pattern LTP'1 and a second light transmission pattern LTP'2. In an embodiment, the first planarization layer PNL1 may be selectively disposed only in the area E of FIG. 11. In such an embodiment, the first planarization layer PNL1 may be selectively disposed in the area where the connection parts CP'1 and CP'2 are located.

Accordingly, in the area E of FIG. 11, the first light transmission pattern LTP'1 may be disposed on the encapsulation layer ENC. In addition, the first planarization layer PNL1 may cover the first light transmission pattern LTP'1 and may be disposed on the encapsulation layer ENC. Also, the second light transmission pattern LTP'2 may be disposed on the first planarization layer PNL1. In addition, the second planarization layer PNL2 may cover the second light transmission pattern LTP'2 and may be disposed on the first planarization layer PNL1.

In an embodiment, as described with reference to FIG. 13, the first connection parts CP'1 may be disposed in the first opening defined in the first light transmission pattern LTP'1. In an embodiment, for example, the first connection parts CP'1 may surround at least a portion of a side surface of the first light transmission pattern LTP'1. Accordingly, the first connection parts CP'1 may be covered by the first planarization layer PNL1.

In an embodiment, the second connection parts CP'2 may be disposed in the second opening defined in the second light transmission pattern LTP'2. In an embodiment, for example, the second connection parts CP'2 may surround at least a portion of the side surface of the second light transmission pattern LTP'2. Accordingly, the second connection portions CP'2 may be covered by the second planarization layer PNL2.

In such an embodiment, the first connection parts CP'1 and the second connection parts CP'2 may not contact each other due to the first planarization layer PNL1.

Figure 16:
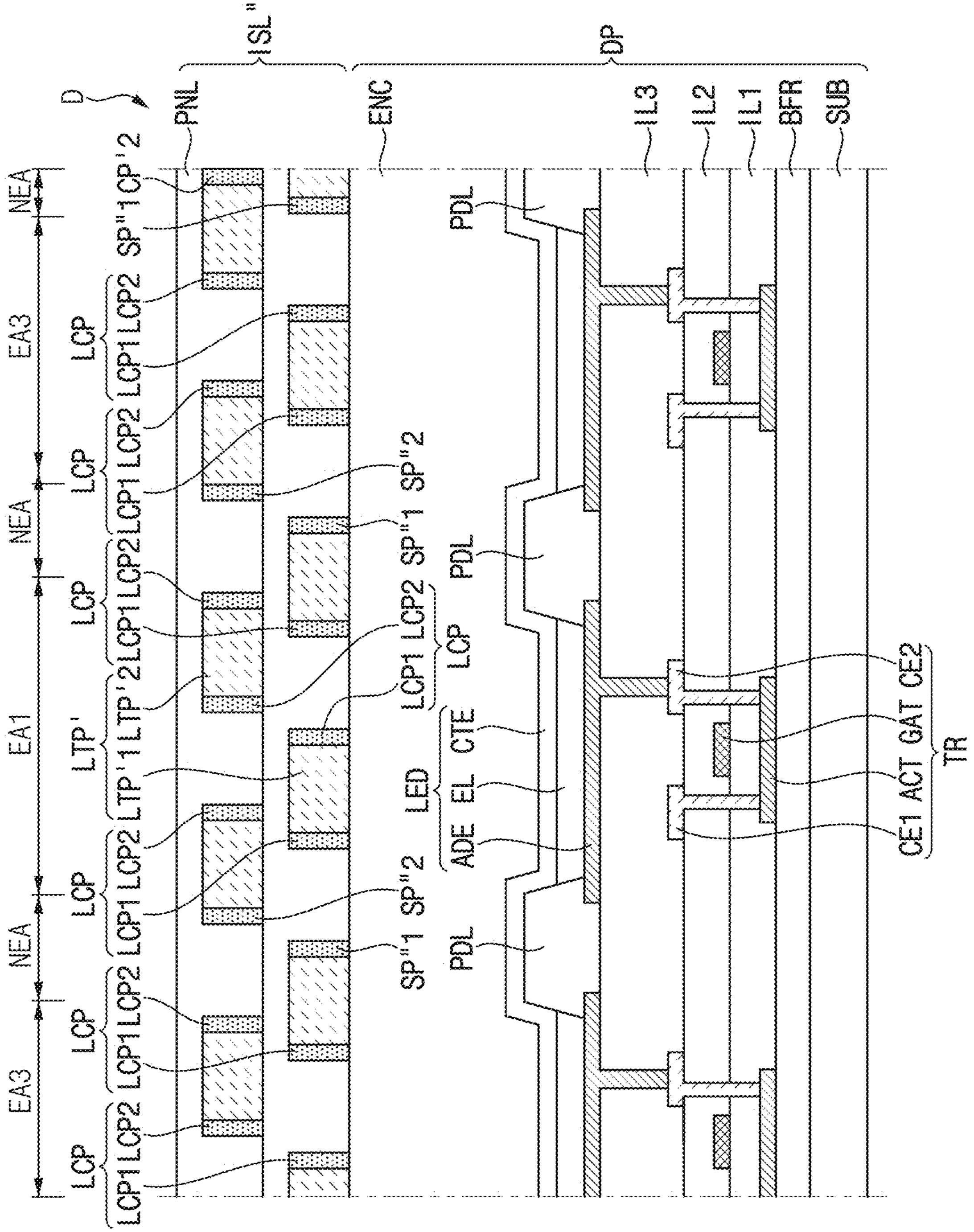
FIG. 16 is a cross-sectional view illustrating an area D of FIG. 11 according to another alternative embodiment.

FIG. 16 is a cross-sectional view illustrating an area D of FIG. 11 according to another alternative embodiment.

Referring to FIG. 16, in an embodiment, the first planarization layer PNL1 may also be disposed in the area D of FIG. 11. In such an embodiment, the first planarization layer PNL1 may also be disposed in the area where the sensing parts SP"1 and SP"2 are located. In an embodiment, for example, the first planarization layer PNL1 may be disposed on entire surface of the input sensing layer ISL".

Accordingly, in the area D of FIG. 11, the first light transmission pattern LTP'1 may be disposed on the encapsulation layer ENC. In addition, the first planarization layer PNL1 may cover the first light transmission pattern LTP'1 and may be disposed on the encapsulation layer ENC. Also, the second light transmission pattern LTP'2 may be disposed on the first planarization layer PNL1. In addition, the second planarization layer PNL2 may cover the second light transmission pattern LTP'2 and may be disposed on the first planarization layer PNL1.

In an embodiment, as described with reference to FIG. 12, the first sensing parts SP"1 (or the body part of the first sensing parts SP"1) may be disposed in the first opening defined in the first light transmission pattern LTP1. In an embodiment, for example, the first sensing parts SP"1 (or the body part of the first sensing parts SP"1) may surround at least a portion of a side surface of the first light transmission pattern LTP1. Accordingly, the first sensing parts SP"1 (or the body part of the first sensing parts SP'1) may be covered by the first planarization layer PNL1.

In an embodiment, the second sensing parts SP"2 (or the body part of the second sensing parts SP"2) may be disposed in the second opening defined in the second light transmission pattern LTP2. In an embodiment, for example, the second sensing parts SP"2 (or the body part of the second sensing parts SP"2) may surround at least a portion of a side surface of the second light transmission pattern LTP2. Accordingly, the second sensing parts SP"2 (or the body part of the second sensing parts SP"2) may be covered by the second planarization layer PNL2.

In such an embodiment, the first sensing parts SP"1 (or the body part of the first sensing parts SP"1) and the second sensing parts SP"2 (or the body part of the second sensing parts SP"2) may not contact each other due to the first planarization layer PNL1.

According to embodiments, the display device may include the display panel and the input sensing layer disposed on the display panel. The input sensing layer may include the light transmission pattern, the light control pattern, the first electrode pattern operating as a sensing electrode (Rx) when external input is sensed, and the second electrode pattern operating as a driving electrode (Tx) when external input is sensed. In such embodiments, the light control pattern, the first electrode pattern, and the second electrode pattern may be arranged to surround a side surface of the light transmission pattern. Accordingly, an external input such as a touch or approach by an external medium may be sensed and a viewing angle of light emitted from the light emitting area may be controlled through the input sensing layer. In such embodiments, the display device may not separately include a functional layer for sensing an external input and a functional layer for controlling a viewing angle. Accordingly, a stacked structure of the display device may be simplified and efficiency of the manufacturing process of the display device may be improved.

In embodiments, the light control pattern, the first electrode pattern, and the second electrode pattern may be directly connected to each other. Accordingly, floating of the light control pattern may be substantially reduced or effectively prevented. In such embodiments, an occurrence of a phenomenon in which the light control pattern is separated from underlying structures may be substantially reduced or effectively prevented. Accordingly, driving efficiency and structural reliability of the display device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate on which a light emitting area is defined;

a light emitting element disposed in the light emitting area on the substrate;

an encapsulation layer disposed on the substrate and covering the light emitting element;

a light transmission pattern disposed on the encapsulation layer;

a light control pattern disposed on the encapsulation layer and disposed to surround at least a portion of a side surface of the light transmission pattern;

a first electrode pattern disposed on the encapsulation layer to be spaced apart from the light emitting area and to surround at least a portion of the side surface of the light transmission pattern, wherein the first electrode pattern extends along a first direction, and is directly connected to at least a portion of the light control pattern; and a second electrode pattern disposed on the encapsulation layer to be spaced apart from the light emitting area and to surround at least a portion of the side surface of the light transmission pattern, wherein the second electrode pattern extends along a second direction crossing the first direction, and is directly connected to at least a portion of the light control pattern.

2. The display device of claim 1, wherein the light control pattern, the first electrode pattern, and the second electrode pattern include a same material as each other.

3. The display device of claim 2, wherein each of the light control pattern, the first electrode pattern, and the second electrode pattern includes molybdenum (Mo).

4. The display device of claim 1, wherein the first electrode pattern and the second electrode pattern have a mesh structure.

5. The display device of claim 1, wherein the first electrode pattern includes:

first sensing parts arranged along the first direction; and first connection parts electrically connecting the first sensing parts to each other, and the second electrode pattern includes:

second sensing parts arranged along the second direction; and second connection parts electrically connecting the second sensing parts to each other.

6. The display device of claim 5, wherein the light control pattern includes:

a first light control pattern disposed on the encapsulation layer; and a second light control pattern disposed on the first light control pattern, and the light transmission pattern includes:

a first light transmission pattern in which at least a portion of a side surface is surrounded by the first light control pattern; and a second light transmission pattern in which at least a portion of a side surface is surrounded by the second light control pattern.

7. The display device of claim 6, wherein the first sensing parts include:

a first body part disposed to surround at least a portion of the side surface of the first light transmission pattern; and a second body part disposed on the first body part, disposed to surround at least a portion of the side surface of the second light transmission pattern, and contacting the first body part, and the second sensing parts include:

a third body part disposed to surround at least a portion of the side surface of the first light transmission pattern; and a fourth body part disposed on the third body part, disposed to surround at least a portion of the side surface of the second light transmission pattern, and contacting the third body part.

8. The display device of claim 7, wherein the first light control pattern, the first body part, and the third body part include a same material as each other, and the second light control pattern, the second body part, and the fourth body part include a same material as each other.

9. The display device of claim 8, further comprising:

a first touch signal line electrically connected to the first electrode pattern; and a second touch signal line electrically connected to the second electrode pattern.

10. The display device of claim 9, wherein the first electrode pattern is a sensing electrode, the second electrode pattern is a driving electrode, the first touch signal line is a touch sensing line, and the second touch signal line is a touch driving line.

11. The display device of claim 6, wherein the first sensing parts include a first body part disposed to surround at least a portion of the side surface of the first light transmission pattern, wherein the first body part includes a same material as the first light control pattern, the second sensing parts include a second body part disposed on the first sensing parts to surround at least a portion of the side surface of the second light transmission pattern, wherein the second body part includes a same material as the second light control pattern, and the first body part of the first sensing parts and the second body part of the second sensing parts are spaced apart from each other.

12. The display device of claim 11, further comprising:
a first touch signal line electrically connected to the first electrode pattern; and
a second touch signal line electrically connected to the second electrode pattern.

13. The display device of claim 12, wherein
the first electrode pattern is a sensing electrode,
the second electrode pattern is a driving electrode,
the first touch signal line is a touch sensing line, and
the second touch signal line is a touch driving line.

14. The display device of claim 6, wherein
the first sensing parts surround at least a portion of the side surface of the first light transmission pattern, include a same material as the first light control pattern, and are electrically connected to each other by a bridge electrode, and
the bridge electrode is disposed to surround at least a portion of the side surface of the second light transmission pattern, and includes a same material as the second light control pattern.

15. The display device of claim 6, wherein
the first connection parts are disposed to surround at least a portion of the side surface of the first light transmission pattern,
the second connection parts are disposed on the first connection parts to surround at least a portion of the side surface of the second light transmission pattern, and
the first connection parts and the second connection parts are spaced apart from each other.

16. The display device of claim 15, further comprising:
a dummy electrode pattern disconnected from the first electrode pattern and the second electrode pattern,
wherein the dummy electrode pattern includes a same material as the first electrode pattern and the second electrode pattern, and is directly connected to at least a portion of the light control pattern.

17. A display device comprising:
a substrate on which a light emitting area is defined;
a light emitting element disposed in the light emitting area on the substrate;
an encapsulation layer disposed on the substrate and covering the light emitting element;
a first light control pattern disposed on the encapsulation layer;
a first electrode pattern disposed on the encapsulation layer and directly connected to the first light control pattern, wherein the first electrode pattern includes first sensing parts arranged along a first direction and first connection parts electrically connecting the first sensing parts to each other;
a first light transmission pattern disposed on the encapsulation layer, wherein at least a portion of a side surface of the first light transmission pattern is surrounded by the first light control pattern and the first electrode pattern;
a second light control pattern disposed on the first light control pattern;
a second electrode pattern disposed on the encapsulation layer and directly connected to the second light control pattern, wherein the second electrode pattern includes second sensing parts arranged along a second direction crossing the first direction and second connection parts electrically connecting the second sensing parts to each other;
a second light transmission pattern disposed on the encapsulation layer, wherein at least a portion of a side surface of the second light transmission pattern is surrounded by the second light control pattern and the second electrode pattern;
a first planarization layer disposed between the first connection parts of the first electrode pattern and the second connection parts of the second electrode pattern; and
a second planarization layer covering the second connection parts of the second electrode pattern.

18. The display device of claim 17, wherein the first connection parts and the second connection parts are spaced apart from each other.

19. The display device of claim 17, wherein
the first connection parts are disposed to surround at least a portion of the side surface of the first light transmission pattern, and
the second connection parts are disposed to surround at least a portion of the side surface of the second light transmission pattern.

20. The display device of claim 17, wherein
the first sensing parts are disposed to surround at least a portion of the side surface of the first light transmission pattern, and include a same material as the first light control pattern,
the second sensing parts are disposed on the first sensing parts to surround at least a portion of the side surface of the second light transmission pattern, and include a same material as the second light control pattern, and
the first planarization layer is further disposed between the first sensing parts of the first electrode pattern and the second sensing parts of the second electrode pattern.

21. The display device of claim 20, wherein the first sensing parts and the second sensing parts are spaced apart from each other.

22. The display device of claim 20, further comprising:
a first touch signal line electrically connected to the first sensing parts; and
a second touch signal line electrically connected to the second sensing parts.

23. The display device of claim 22, wherein
the first electrode pattern is a sensing electrode,
the second electrode pattern is a driving electrode,
the first touch signal line is a touch sensing line, and
the second touch signal line is a touch driving line.

24. The display device of claim 17, wherein the first electrode pattern and the second electrode pattern are spaced apart from the light emitting area.

25. The display device of claim 17, wherein the first electrode pattern and the second electrode pattern have a mesh structure.

* * * * *